US012677410B2

(12) United States Patent
Sohn et al.

(10) Patent No.: US 12,677,410 B2
(45) Date of Patent: Jul. 7, 2026

(54) SEMICONDUCTOR MEMORY DEVICE AND METHOD FOR MANUFACTURING THE SAME

(71) Applicant: SAMSUNG ELECTRONICS CO., LTD., Suwon-si (KR)

(72) Inventors: Wan Gi Sohn, Suwon-si (KR); Kyeong Hwan Kang, Suwon-si (KR); Sung Hyun Bae, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 451 days.

(21) Appl. No.: 18/101,319

(22) Filed: Jan. 25, 2023

(65) Prior Publication Data

US 2023/0363147 A1 Nov. 9, 2023

(30) Foreign Application Priority Data

May 6, 2022 (KR) ........................ 10-2022-0056169

(51) Int. Cl.
*H10B 12/00* (2023.01)

(52) U.S. Cl.
CPC ............. *H10B 12/48* (2023.02); *H10B 12/02* (2023.02)

(58) Field of Classification Search
CPC ........ H10B 12/48; H10B 12/02; H10B 12/09; H10B 12/033; H10B 12/315; H10B 12/30; H10D 1/716
See application file for complete search history.

(56) References Cited

U.S. PATENT DOCUMENTS

| | | | | |
|---|---|---|---|---|
| 7,459,745 B2 * | 12/2008 | Lee | ........................ | H10D 1/716 |
| | | | | 257/306 |
| 8,030,158 B2 | 10/2011 | Kang et al. | | |
| 8,071,439 B2 | 12/2011 | Hirota | | |
| 8,716,833 B2 | 5/2014 | Koo | | |
| 10,439,048 B2 | 10/2019 | Lim et al. | | |
| 10,546,917 B1 | 1/2020 | Tsai et al. | | |

(Continued)

FOREIGN PATENT DOCUMENTS

| | | |
|---|---|---|
| KR | 10-2009-0117316 A | 11/2009 |
| KR | 10-2022-0056084 A | 5/2022 |

OTHER PUBLICATIONS

Communication dated Nov. 24, 2025, issued by the Korean Intellectual Property Office in Korean Patent Application No. 10-2022-0056169.

*Primary Examiner* — Bitew A Dinke
(74) *Attorney, Agent, or Firm* — Sughrue Mion, PLLC

(57) ABSTRACT

A semiconductor memory device may include: a substrate extending in each of a first direction and a second direction that intersect each other; and storage patterns disposed on the substrate, and spaced apart from each other in each of the first and second directions. Each of the storage patterns extends in a third direction intersecting a plane defined by the first and second directions, and include a face in contact with a respective one from among storage contacts. The face of each of the storage patterns has a first width along the first direction and a second width along the second direction. The first width of the face of the storage patterns increases in a relative manner to each other in the first direction, while spacings in the first direction between adjacent ones of the storage patterns decrease in a relative manner to each other in the first direction.

15 Claims, 25 Drawing Sheets

(56)                 References Cited

U.S. PATENT DOCUMENTS

| | | | |
|---|---|---|---|
| 2002/0155656 A1* | 10/2002 | Hayano | H01L 21/76897<br>257/E21.507 |
| 2005/0054159 A1* | 3/2005 | Manning | H10D 1/042<br>257/E21.648 |
| 2007/0202687 A1 | 8/2007 | Han | |
| 2008/0035975 A1* | 2/2008 | Nakagawa | H10B 12/485<br>438/243 |
| 2010/0065531 A1* | 3/2010 | Kiehlbauch | H10D 89/10<br>216/41 |
| 2012/0049380 A1* | 3/2012 | Kim | H10B 12/033<br>257/773 |
| 2012/0104559 A1* | 5/2012 | Kim | H10D 1/716<br>257/618 |
| 2012/0235279 A1* | 9/2012 | Seo | H10D 1/716<br>257/532 |
| 2012/0299073 A1* | 11/2012 | Mikasa | H10B 12/053<br>257/296 |
| 2013/0228837 A1* | 9/2013 | Sukekawa | H10B 12/033<br>257/532 |
| 2015/0279842 A1* | 10/2015 | Komeda | H10B 12/033<br>257/532 |
| 2015/0325636 A1* | 11/2015 | Otsuka | H10D 1/716<br>257/534 |
| 2017/0194245 A1 | 7/2017 | Patil et al. | |
| 2017/0256628 A1* | 9/2017 | Lim | H01L 21/76816 |
| 2018/0012955 A1* | 1/2018 | Lee | H10B 12/318 |
| 2018/0158827 A1* | 6/2018 | You | H10B 12/033 |
| 2019/0164985 A1* | 5/2019 | Lee | H10D 1/714 |
| 2019/0189619 A1* | 6/2019 | Pak | H01L 21/28568 |
| 2019/0206869 A1* | 7/2019 | Kim | H10B 12/20 |
| 2020/0111793 A1* | 4/2020 | Kim | H10D 88/00 |
| 2020/0152584 A1* | 5/2020 | Sohn | H01L 23/64 |
| 2021/0272961 A1* | 9/2021 | Tung | H10B 12/34 |
| 2021/0320106 A1 | 10/2021 | Teo | |
| 2021/0405521 A1 | 12/2021 | Kim et al. | |
| 2022/0013525 A1* | 1/2022 | Cho | H10B 12/05 |
| 2022/0130949 A1* | 4/2022 | Huang | H10D 1/716 |
| 2022/0199922 A1* | 6/2022 | Choi | B32B 27/40 |

* cited by examiner

1

SEMICONDUCTOR MEMORY DEVICE AND METHOD FOR MANUFACTURING THE SAME

CROSS-REFERENCE TO THE RELATED APPLICATION

This application claims priority from Korean Patent Application No. 10-2022-0056169 filed on May 6, 2022, in the Korean Intellectual Property Office, and all the benefits accruing therefrom under 35 U.S.C. 119, the contents of which in its entirety are herein incorporated by reference.

BACKGROUND

1. Technical Field

Embodiments of the present disclosure relate to a semiconductor memory device and a method for manufacturing the same.

2. Description of the Related Art

A semiconductor device for a memory such as a Dynamic Random Access Memory (DRAM) device may store therein information such as data or a command of a program, and may read the stored information therefrom and store therein other information. One memory device may be composed of one transistor and one capacitor. In order to improve capacity of the memory device including the capacitor, it is important to increase capacitance of the capacitor.

To obtain improved performance within an allowed cell area, a structure such as the capacitor may be formed to have a high aspect ratio. When the structures such as the capacitors having a high aspect ratio are arranged in a plurality of arrays, the structures may be bent in a direction in which an external force acts.

SUMMARY

According to an aspect of the present disclosure, a semiconductor memory device is provided in which structures having a high aspect ratio may be prevented from being bent, thereby improving reliability and performance of the semiconductor memory device.

According to an aspect of the present disclosure, a method for manufacturing a semiconductor memory device is provided in which structures having a high aspect ratio may be prevented from being bent, thereby improving reliability and performance of the semiconductor memory device.

According to embodiments of the present disclosure, a semiconductor memory device is provided. The semiconductor memory device includes: a substrate extending in each of a first direction and a second direction that intersect each other; and a plurality of storage patterns disposed on the substrate, and spaced apart from each other in each of the first direction and the second direction, wherein each of the plurality of storage patterns extends in a third direction intersecting a plane defined by the first direction and the second direction, and each of the plurality of storage patterns comprises a first face in contact with a respective one from among a plurality of storage contacts, wherein the first face of each of the plurality of storage patterns has a first width along the first direction and a second width along the second direction, and wherein the first width of the first face of each of the plurality of storage patterns increases in a relative manner to each other in the first direction, while spacings in the first direction between adjacent ones of the plurality of storage patterns decrease in a relative manner to each other in the first direction.

According to embodiments of the present disclosure, a semiconductor memory device is provided. The semiconductor memory device includes: a substrate comprising a cell area on which a memory cell array is disposed, and a peripheral area disposed around the cell area, wherein the substrate extends in each of a first direction and a second direction that intersect each other; and a plurality of storage patterns disposed on the substrate, and extending in a third direction intersecting a plane defined by the first direction and the second direction, wherein the plurality of storage patterns are respectively connected to a plurality of storage contacts, wherein the plurality of storage patterns comprises a first storage pattern adjacent to the cell area, a second storage pattern adjacent to the peripheral area, and a third storage pattern between the first storage pattern and the second storage pattern, and wherein a width of the first storage pattern along the first direction, a width of the second storage pattern along the first direction, and a width of the third storage pattern along the first direction gradually increase or decrease in a relative manner to each other as the plurality of storage patterns are closer to the peripheral area.

According to embodiments of the present disclosure, a method for manufacturing a semiconductor memory device is provided. The method includes: forming a substrate extending in each of a first direction and a second direction that intersect each other; and forming a plurality of storage patterns on the substrate using a mask pattern based on layout data, wherein each of the plurality of storage patterns extends in a third direction intersecting a plane defined by the first direction and the second direction, wherein the layout data includes data about a plurality of target patterns and a plurality of corrected patterns, wherein the plurality of corrected patterns are respectively obtained by gradually changing critical dimensions of the plurality of target patterns in a relative manner to each other in one direction opposite to a direction in which an external force is applied to the plurality of storage patterns, and wherein the forming the plurality of storage patterns comprises forming the mask pattern based on the plurality of corrected patterns.

Aspects of the present disclosure are not limited to the above-mentioned aspects. Other aspects and advantages according to embodiments of the present disclosure that are not mentioned may be understood based on following descriptions, and may be more clearly understood based on embodiments of the present disclosure. Further, it will be easily understood that the purposes and advantages according to embodiments of the present disclosure may be realized using means described in the claims and combinations thereof.

BRIEF DESCRIPTION OF DRAWINGS

The above and other aspects and features of embodiments of the present disclosure will become more apparent by describing in detail non-limiting example embodiments thereof with reference to the attached drawings, in which.

DETAILED DESCRIPTION

Figure 1:
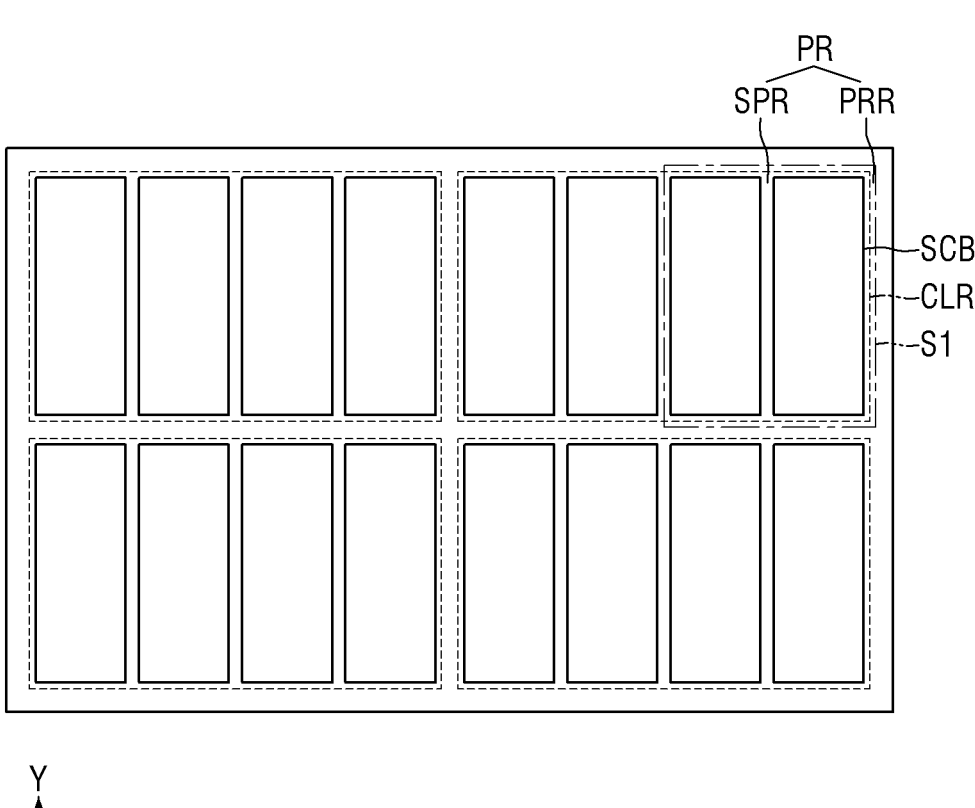
FIG. 1 is a block diagram for illustrating a semiconductor memory device according to some embodiments.
Figure 1:
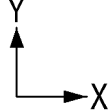

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure.

A shape, a size, a ratio, an angle, a number, etc. disclosed in the drawings for illustrating embodiments of the present disclosure are illustrative, and embodiments of the present disclosure are not limited thereto.

The terminology used herein is for the purpose of describing non-limiting example embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section described below could be termed a second element, component, region, layer, or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated.

The features of the various embodiments of the present disclosure may be partially or entirely combined with each other, and may be technically associated with each other or operate with each other. The embodiments may be implemented independently of each other and may be implemented together in an association relationship.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings is turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

Figure 2:
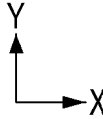
FIG. 2 is an enlarged view of an area of FIG. 1.
Figure 3:
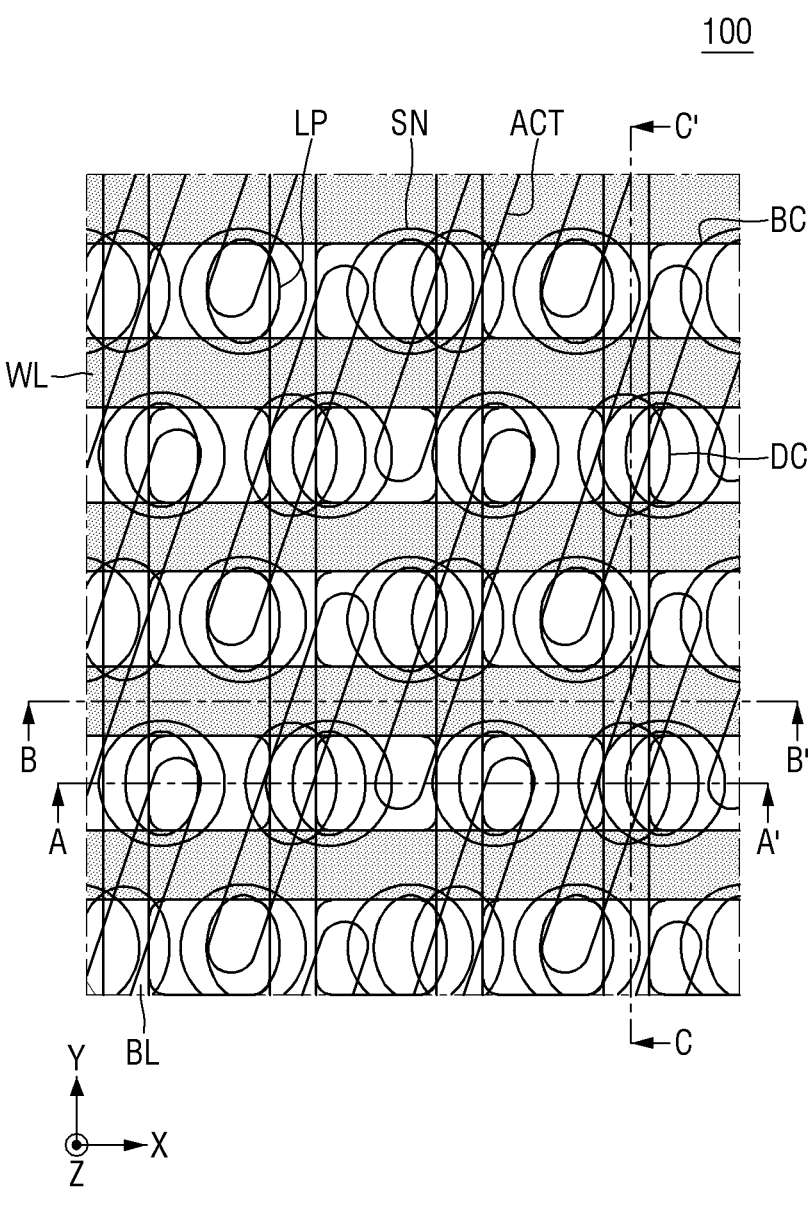
FIG. 3 is a schematic layout diagram for illustrating a semiconductor memory device according to some embodiments.
Figure 4:
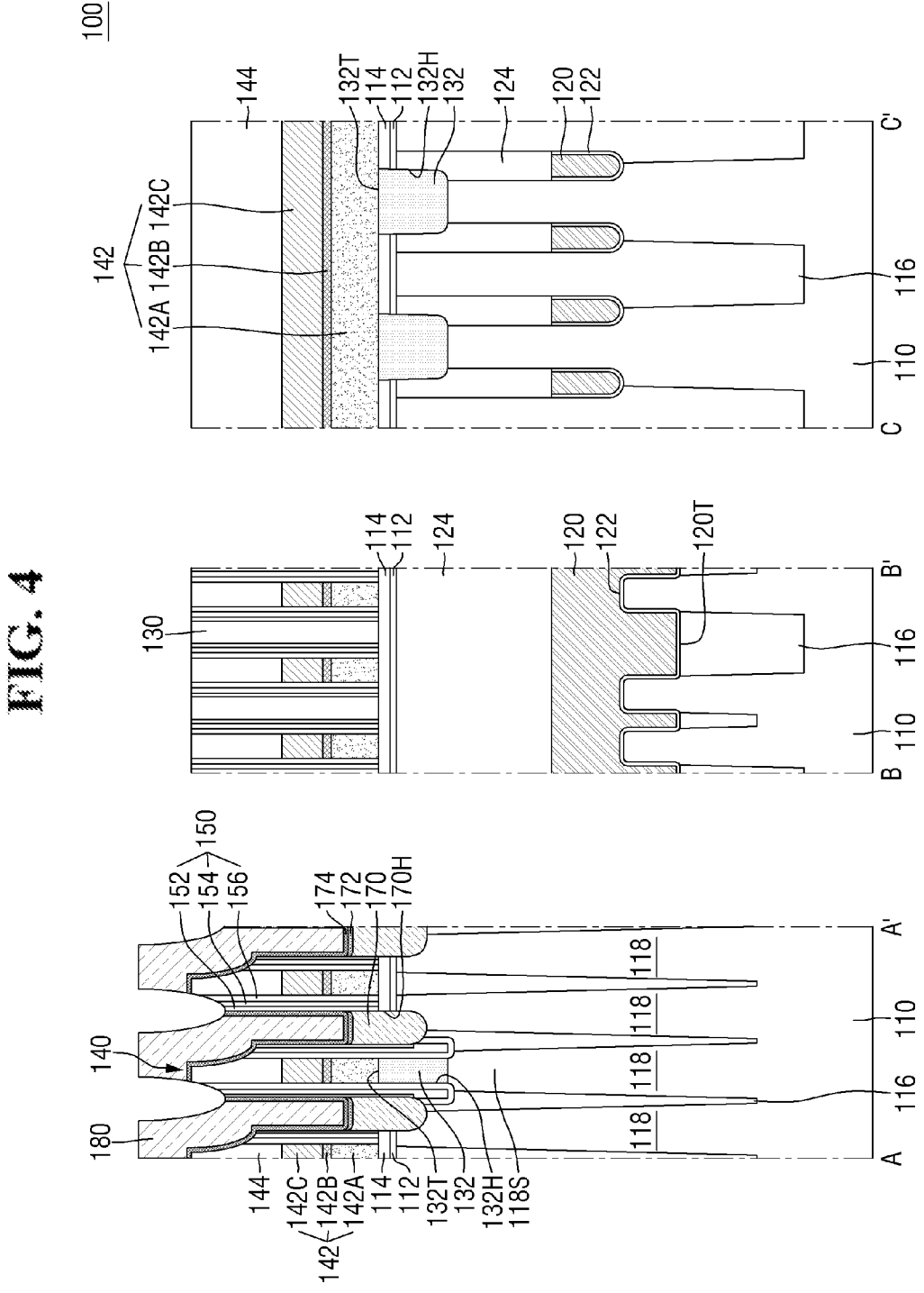
FIG. 4 is a cross-section diagram illustrating a portion of a semiconductor memory device according to some embodiments.

FIG. 1 is a block diagram for illustrating a semiconductor memory device according to some embodiments. FIG. 2 is an enlarged view of an area S1 of FIG. 1. FIG. 3 is a schematic layout diagram for illustrating a semiconductor memory device according to some embodiments. FIG. 4 is a cross-section diagram illustrating a portion of a semiconductor memory device according to some embodiments.

Referring to FIG. 1, a semiconductor element may include a cell area CLR in which memory cells are disposed and a peripheral area PR surrounding the cell area CLR.

According to some embodiments, a plurality of a sub-peripheral area SPR for defining a plurality of a cell block area SCB may be included in the cell area CLR. A plurality of memory cells may be disposed in the cell block area SCB. In some embodiments, the cell block area SCB may mean an area in which memory cells are regularly arranged at a regular spacing.

Logic cells for input/outputting an electrical signal to/from the memory cells may be disposed in the peripheral area PR. The peripheral area PR may include a main peripheral area PRR and a plurality of a sub-peripheral area SPR. The sub-peripheral area SPR may act as a space for defining the cell block area SCB.

In the drawings related to the semiconductor memory device according to some embodiments, Dynamic Random Access Memory (DRAM) is illustrated by way of example. However, embodiments of the present disclosure are not limited thereto.

Referring to FIG. 1 and FIG. 2, a plurality of storage nodes SN spaced apart from each other may be disposed. In some embodiments, each of the plurality of storage nodes SN may refer to each of a plurality of a lower electrode 520 (refer to FIG. 5) of a plurality of storage structures 500 (refer to FIG. 5).

In some embodiments, the storage nodes SN may be arranged in a honeycomb manner such that the storage nodes SN are arranged in a zigzag in one direction. In some embodiments, the storage nodes SN may be arranged in a matrix manner. A width of the sub-peripheral area SPR may have a larger value than a pitch that is a distance between centers of two adjacent storage nodes SN in one cell block area SCB. However, embodiments of the present disclosure are not limited thereto.

Referring to FIG. 3, a semiconductor memory device 100 may include a plurality of an active area ACT. The active area ACT may be defined by an element isolation layer 116 formed within a substrate 110 (refer to FIG. 4). According to reduction of a design rule, the plurality of the active area ACT may be arranged in a form of a bar extending in an oblique or diagonal line with respect to a first direction X and a second direction Y.

A plurality of gate electrodes extending in the first direction X and across the active area ACT may be disposed. The plurality of gate electrodes may extend in a parallel manner to each other. The plurality of gate electrodes may be, for example, a plurality of word-lines WL. The word-lines WL may be spaced from each other by an equal spacing. A width of the word-lines WL or a spacing between the word-lines WL may be determined according to a design rule.

A plurality of bit-lines BL extending in the second direction Y perpendicular to the word-lines WL may be disposed on the word-lines WL. The plurality of bit-lines BL may extend in a parallel manner to each other. The bit-lines BL may be spaced from each other by an equal spacing. A width of the bit-lines BL or a spacing between the bit-lines BL may be determined according to a design rule.

The semiconductor memory device according to some embodiments may include various contact arrangements formed on the active area ACT. The various contact arrangements may include, for example, a direct contact (DC), a buried contact (BC), and a landing pad (LP), and the like.

The direct contact DC may mean a contact that electrically connects the active area ACT to at least one of the bit-lines BL.

A plurality of the buried contact BC may be formed between two adjacent bit-lines BL among the plurality of bit-lines BL. In some embodiments, each of the plurality of the buried contact BC may extend to a top of one of the bit-lines BL among two bit-lines BL adjacent to each other. In some embodiments, the plurality of the buried contact BC may be arranged in a line along each of the first direction X and the second direction Y.

A plurality of landing pads LP may be formed on the plurality of the buried contact BC. The plurality of landing pads LP may at least partially overlap the plurality of the buried contact BC. The plurality of landing pads LP may extend to a top of one of the bit-lines BL adjacent thereto.

The plurality of storage nodes SN may be formed on the plurality of landing pads LP. The plurality of storage nodes SN may be formed on the plurality of bit-lines BL. The storage nodes SN may each be connected to the active area ACT via one of the landing pads LP and the buried contact BC.

The one of the landing pads LP may be disposed between the buried contact BC and the lower electrode 520. Introduction of the landing pads LP may increase a contact area, such that a contact resistance between the active area ACT and the lower electrode 520 of the capacitor may be reduced.

Referring to FIG. 4, the semiconductor memory device 100 includes the substrate 110 in which a plurality of the active area 118 are defined by the element isolation layer 116. The plurality of the active area 118 may correspond to the plurality of active areas ACT shown in FIG. 3.

In some embodiments, the substrate 110 may include silicon, for example, monocrystalline silicon, polycrystalline silicon, or amorphous silicon. In some other embodiments, the substrate 110 may include at least one selected from germanium (Ge), silicon germanium (SiGe), and silicon carbonitride (SiC). In some other embodiments, the substrate 110 may include a conductive area, for example, a well doped with impurity, or a structure doped with impurity.

A plurality of trenches 120T extending in the first direction X (refer to FIG. 3) is formed in the substrate 110, and a plurality of gate dielectric films 122 and a plurality of word-lines 120 are respectively formed in the plurality of trenches 120T. The plurality of word-lines 120 may correspond to the plurality of word-lines WL as shown in FIG. 3.

A vertical level of a top face of one of the word-lines 120 may be lower than a vertical level of a top face of the active area ACT. A word-line capping pattern 124 may be disposed on each of the word-lines 120. The word-line capping pattern 124 may have a line shape extending along each of the word-lines 120, and may cover an entirety of a top face of each of the word-lines 120. The word-line capping pattern 124 may include, for example, silicon nitride.

A plurality of direct contact holes 132H respectively exposing portions of the active area 118 are formed in the substrate 110. Direct contact conductive patterns 132 may fill each of the plurality of direct contact holes 132H, respectively. The plurality of direct contact conductive patterns 132 may constitute the direct contact DC as shown in FIG. 3.

A first buffer insulating film pattern 112 and a second buffer insulating film pattern 114 are sequentially formed on the substrate 110. Each of the first buffer insulating film pattern 112 and the second buffer insulating film pattern 114 may be made of silicon oxide, silicon nitride, or a combination thereof.

A plurality of bit-lines 142 extending in a parallel manner to each other and in a second direction Y (refer to FIG. 3) are formed on the second buffer insulating film pattern 114. The plurality of bit-lines 142 may correspond to the plurality of bit-lines BL as shown in FIG. 3. Each of the plurality of bit-lines 142 may be connected to the active area 118 via at least one of the direct contact conductive patterns 132.

In some embodiments, each of the plurality of direct contact conductive patterns 132 may have a top face 132T coplanar with a top face of the second buffer insulating film pattern 114.

In some embodiments, the direct contact conductive patterns 132 may be made of silicon (Si), germanium (Ge), tungsten (W), tungsten nitride (WN), cobalt (Co), nickel (Ni), aluminum (Al), molybdenum (Mo), ruthenium (Ru), titanium (Ti), titanium nitride (TiN), tantalum (Ta), tantalum nitride (TaN), copper (Cu), or a combination thereof. Further, in some embodiments, each of the plurality of direct contact conductive patterns 132 may be composed of an epitaxial silicon layer.

Each of the plurality of bit-lines 142 includes a first conductive pattern 142A in contact with a top face 132T of at least one of the direct contact conductive patterns 132. In some embodiments, each of the plurality of bit-lines 142 may further include a second conductive pattern 142B and the third conductive pattern 142C sequentially covering the first conductive pattern 142A. Although each of the plurality of bit-lines 142 is shown to have a stacked structure of three conductive layers including the first conductive pattern 142A, the second conductive pattern 142B, and the third conductive pattern 142C in FIG. 4, embodiment of the present disclosure are not limited thereto. For example, each of the plurality of bit-lines 142 may be composed of a single layer or a stacked structure of two layers or at least four layers.

In some embodiments, the first conductive pattern 142A may include conductive polysilicon. In some embodiments, the second conductive pattern 142B may include titanium nitride (TiN). In some embodiments, the third conductive pattern 142C may include tungsten (W).

An insulating capping line 144 may be formed on each of the plurality of bit-lines 142. One of the bit-lines 142, and one insulating capping line 144 covering the one of the bit-lines 142 may constitute one of the bit-line structures 140.

Each of both opposing sidewalls of each of the plurality of bit-line structures 140 may be covered with an insulating spacer structure 150. Each of the plurality of the insulating spacer structure 150 may include a first insulating spacer 152, a second insulating spacer 154, and a third insulating spacer 156.

In some embodiments, each of the first insulating spacer 152, the second insulating spacer 154, and the third insulating spacer 156 may be composed of an oxide film, a nitride film, or a combination thereof. In some other embodiments, each of the first insulating spacer 152 and the third insulating spacer 156 may be composed of an oxide film, a nitride film, or a combination thereof, while the second insulating spacer 154 interposed between the first insulating spacer 152 and the third insulating spacer 156 may be composed of an air spacer.

A plurality of insulating patterns 130 and a plurality of buried contact holes 170H defined by the plurality of the insulating patterns 130 may be formed in a space between adjacent ones of the plurality of bit-lines 142. Each of the plurality of buried contact holes 170H may have an inner space defined by the active area 118 and the insulating spacer structure 150 covering a sidewall of each of two adjacent bit-lines 142 between two adjacent bit-lines 142 among the plurality of bit-lines 142.

A plurality of buried contacts 170 and a plurality of landing pads 180 respectively connected to the plurality of the active area 118 are respectively formed in the plurality of buried contact holes 170H between the plurality of bit-lines 142. The plurality of buried contacts 170 and the plurality of landing pads 180 may correspond to the plurality of buried contacts BC and the plurality of landing pads LP as shown in FIG. 3, respectively.

The plurality of buried contacts 170 may extend from the active area 118 in a third direction Z (refer to FIG. 3) perpendicular to a top face of the substrate 110. The plurality of landing pads 180 may be respectively disposed on the buried contacts 170 and may respectively extend onto the plurality of bit-lines 142. Each of the plurality of landing pads 180 may be connected to the active area 118 via at least one of the buried contacts 170.

The landing pads 180 may extend along the third direction Z perpendicular to the top face of the substrate 110 while being disposed in an area between adjacent ones of the plurality of bit-lines 142 and may cover at least a portion of a top face of each of the plurality of bit-lines 142 so as to vertically overlap with at least a portion of each of the plurality of bit-lines 142.

A metal silicide layer 172 (e.g., a film) may be formed between the buried contacts 170 and the landing pads 180. The metal silicide layer 172 may be made of cobalt silicide ($CoSi_x$), nickel silicide ($NiSi_x$), or manganese silicide ($MnSi_x$). However, embodiments of the present disclosure are not limited thereto.

A conductive barrier film 174 may be interposed between the landing pads 180 and the insulating spacer structure 150 and between the landing pads 180 and each of the plurality of bit-line structures 140. The conductive barrier film 174 may be made of a metal, a conductive metal nitride, or a combination thereof. For example, the conductive barrier film 174 may be composed of a stacked structure of a layer made of titanium (Ti) and a layer made of titanium nitride (TiN). However, embodiments of the present disclosure are not limited thereto.

Figure 5:
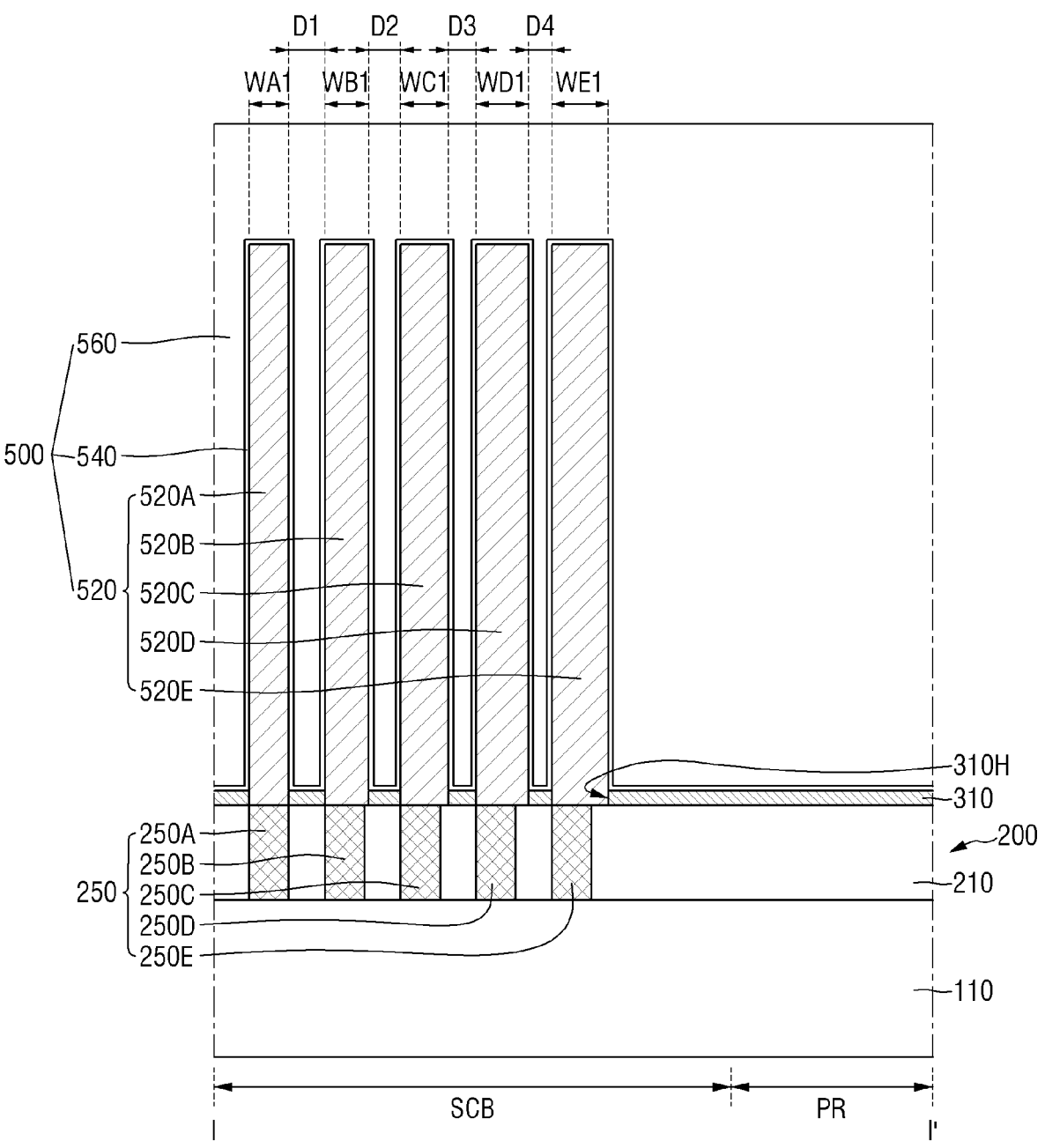
FIG. 5 is a diagram showing main components of a semiconductor memory device according to some embodiments, and is a cross-section diagram taken along a line I-I' of FIG. 2.

FIG. 5 is a diagram showing main components of a semiconductor memory device according to some embodiments, and is a cross-section diagram taken along a line I-I' of FIG. 2. FIG. 5 is a cross-section diagram mainly showing main components above the landing pads 180 of the semiconductor memory device 100 of FIG. 4.

Referring to FIG. 5, the semiconductor memory device 100 may include the substrate 110, a lower structure 200 formed on the substrate 110, and a plurality of contact plugs 250 (e.g., storage contacts) extending through the lower structure 200 and connected to the substrate 110.

The substrate 110, the lower structure 200, and the plurality of contact plugs 250 may schematically represent the substrate 110, components formed on the substrate 110, and components formed in the substrate 110 as shown in FIG. 4. In this case, the semiconductor memory device 100 may be embodied as a semiconductor memory device including a capacitor for storing data therein, such as DRAM.

The plurality of contact plugs 250 may be configured to respectively include the plurality of buried contacts 170 and the plurality of landing pads 180 as shown in FIG. 4. Each of the plurality of contact plugs 250 may be configured to further include the metal silicide layer 172 and the conductive barrier film 174 as shown in FIG. 4. In some embodiments, the lower structure 200 may include the interlayer insulating film 210 filling a space between adjacent ones of the plurality of landing pads 180.

An etch stop film 310 having a through hole 310H corresponding to each of the plurality of contact plugs 250 may be formed on the lower structure 200 of the substrate 110. The etch stop film 310 may include, for example, silicon nitride.

A plurality of storage structures 500 may extend through the etch stop film 310 and may be electrically connected to each of the plurality of contact plugs 250. A plurality of storage structures 500 may be respectively disposed on the landing pads 180 (refer to FIG. 4). The plurality of storage structures 500 may be electrically connected to the landing pads 180 via the plurality of contact plugs 250, respectively. A portion of the storage structures 500 may be disposed within the etch stop film 310.

The storage structures 500 may include, for example, a capacitor. However, embodiments of the present disclosure are not limited thereto. The storage structures 500 may include a lower electrode 520, a capacitor dielectric film 540, and an upper electrode 560.

The lower electrode 520 may be disposed on one of the contact plugs 250. A plurality of the lower electrode 520 may be spaced apart from each other in the first direction X and second direction Y that are parallel to the top face of the substrate 110 and intersect each other. The lower electrode 520 may extend in the third direction Z intersecting the first direction X and the second direction Y of the substrate 110. Although the lower electrode 520 is illustrated as having a solid pillar shape having a circular horizontal cross-section in a plan view, embodiments of the present disclosure are not limited thereto. For example, the lower electrode 520 may have a cylindrical shape.

The capacitor dielectric film 540 is formed on the lower electrode 520. The capacitor dielectric film 540 may be formed along a profile of the lower electrode 520. The upper electrode 560 is formed on the capacitor dielectric film 540. The upper electrode 560 may surround an outer sidewall of the lower electrode 520. Although the upper electrode 560 is shown as a single film, this is only for convenience of illustration. Embodiments of the disclosure are not limited thereto.

Each of the lower electrode 520 and the upper electrode 560 may include, for example, at least one of a conductive semiconductor compound, a conductive metal nitride such as titanium nitride, tantalum nitride, niobium nitride, or tungsten nitride, a metal such as ruthenium, iridium, titanium or tantalum, and a conductive metal oxide such as iridium oxide or niobium oxide, etc. Embodiments of the present disclosure are not limited thereto. The semiconductor compound may include doped silicon material.

The capacitor dielectric film 540 may include, for example, one of silicon oxide, silicon nitride, silicon oxynitride, a high dielectric constant material, and combinations thereof. However, embodiments of the present disclosure are not limited thereto. In the semiconductor memory device according to some embodiments, the capacitor dielectric film 540 may include zirconium oxide, aluminum oxide, or a stack structure thereof. In some embodiments, the capacitor dielectric film 540 may have a stacked structure of a ferroelectric material film and an upper dielectric material film.

Each of the storage structures 500 may include a capacitor of DRAM. For example, the lower electrode 520 may act as a lower electrode or a storage node of the capacitor of DRAM, and the upper electrode 560 may act as an upper electrode or a plate electrode of the capacitor of DRAM.

Although not specifically illustrated, a planarized inter-metal insulating layer may be formed on the upper electrode 560. Further, although not specifically shown, a cell contact plug may extend through the inter-metal insulating layer and may be connected to the upper electrode 560 and thus may be electrically connected to the cell block area SCB. Further, although not specifically shown, a peripheral logic contact plug may extend through the inter-metal insulating layer and the etch stop film 310 and may be electrically connected to a peripheral logic area PR.

Referring to FIG. 5, the plurality of the lower electrode 520 may respectively correspond to first to fifth storage patterns 520A, 520B, 520C, 520D, and 520E spaced apart from each other in each of the first direction X and the second direction Y and disposed on the substrate 110. Although it is shown that the number of the storage patterns is five in FIG. 5, the number of the storage patterns in an embodiments of the present disclosure is not limited to the number shown in FIG. 5.

Each of the first to fifth storage patterns 520A, 520B, 520C, 520D, and 520E may have a bottom face in contact with one of the contact plugs 250, a sidewall connected to one face and extending in the third direction Z, and a top face connected to the sidewall and opposite to one face. In some embodiments, descriptions regarding a width and an area of the top face thereof may be equally applied to descriptions regarding a width and an area of the bottom face thereof. Further, the descriptions about the width and the area of each of the bottom and the top face are based on a cross-section of each of the first to fifth storage patterns 520A, 520B, 520C, 520D, and 520E as cut in a parallel manner to the top face of the substrate 110 and may be equally applied to descriptions regarding a width and an area of the cross-section of each of the first to fifth storage patterns 520A, 520B, 520C, 520D, and 520E.

Areas of the top faces of the first to fifth storage patterns 520A, 520B, 520C, 520D, and 520E may be gradually increased or decreased in a relative manner to each other in the first direction X. Although not specifically illustrated, the areas of the top faces of the first to fifth storage patterns 520A, 520B, 520C, 520D, and 520E may be gradually increased or decreased in a relative manner to each other along the second direction Y.

Referring to FIG. 5, first widths WA1, WB1, WC1, WD1, and WE1 along the first direction X of the top faces of the first to fifth storage patterns 520A, 520B, 520C, and 520E may increase gradually in a relative manner to each other in the first direction X. Specifically, the first width WE1 of the fifth storage pattern 520E may be greater than the first width WD1 of the fourth storage pattern 520D. The first width WD1 of the fourth storage pattern 520D may be greater than the first width WC1 of the third storage pattern 520C. The first width WC1 of the third storage pattern 520C may be greater than the first width WB1 of the second storage pattern 520B. The first width WB1 of the second storage pattern 520B may be greater than the first width WA1 of the first storage pattern 520A.

In this case, the areas of the top faces of the first to fifth storage patterns 520A, 520B, 520C, 520D, and 520E may be gradually increased in a relative manner to each other along the first direction X.

The first widths WA1, WB1, WC1, WD1, and WE1 in the first direction of the top faces of the first to fifth storage patterns 520A, 520B, 520C, 520D, and 520E may increase in a relative manner to each other as the patterns are closer to the peripheral area PR. In this case, aspect ratios of the first to fifth storage patterns 520A, 520B, 520C, 520D, and 520E may decrease in a relative manner to each other as the patterns are closer to the peripheral area PR. For example, the first width WA1 along the first direction X of the first storage pattern 520A closest to the innermost side of the cell block area SCB may be smaller than or equal to 20% of the first width WE1 along the first direction X of the fifth storage pattern 520E closest to the peripheral area PR. However, embodiments of the present disclosure are not limited thereto.

Further, spacings D1, D2, D3, and D4 in the first direction X between the top faces of adjacent ones of the first to fifth storage patterns 520A, 520B, 520C, 520D, and 520E may be gradually decreased in a relative manner to each other along the first direction X. Specifically, the spacing D3 between the third storage pattern 520C and the fourth storage pattern 520D may be greater than the spacing D4 between the fourth storage pattern 520D and the fifth storage pattern 520E. The spacing D2 between the second storage pattern 520B and the third storage pattern 520C may be greater than the spacing D3 between the third storage pattern 520C and the fourth storage pattern 520D. The spacing D1 between the first storage pattern 520A and the second storage pattern 520B may be greater than the spacing D2 between the second storage pattern 520B and the third storage pattern 520C.

In one example, although not specifically illustrated, spacings in the second direction Y between the top faces of adjacent ones of the first to fifth storage patterns 520A, 520B, 520C, 520D, and 520E may be gradually decreased or increased in a relative manner to each other along the second direction Y.

The spacings D1, D2, D3, and D4 in the first direction X between the top faces of adjacent ones of the first to fifth storage patterns 520A, 520B, 520C, 520D, and 520E may decrease in a relative manner to each other as the patterns are closer to the peripheral area PR. In one example, although not specifically illustrated, spacings D1, D2, D3, and D4 in the second direction Y between the top faces of adjacent ones of the first to fifth storage patterns 520A, 520B, 520C, 520D, and 520E may decrease in a relative manner to each other as the patterns are closer to the peripheral area PR.

In some embodiments, widths along the first direction X of the first to fifth contact plugs 250A, 250B, 250C, 250D, and 250E may be equal to each other.

Figure 6:
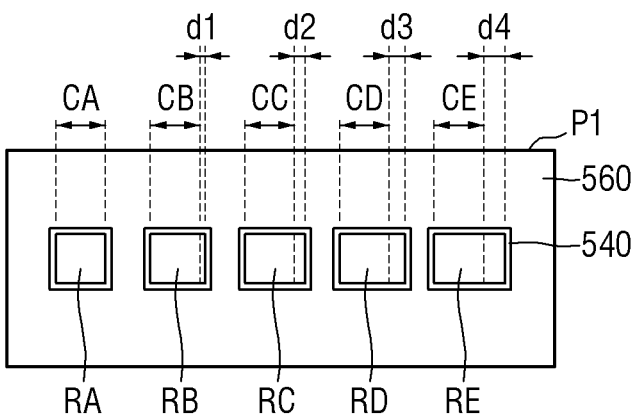
FIG. 6 is a diagram schematically showing layout data used in a portion of FIG. 2 to form a semiconductor memory device according to some embodiments.
Figure 7:
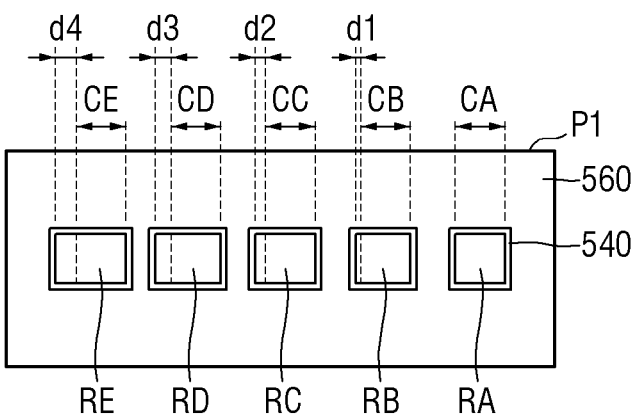
FIG. 7 is a diagram schematically showing layout data used in the portion of FIG. 2 to form a semiconductor memory device according to some embodiments, and is a diagram corresponding to FIG. 6.
Figure 8:
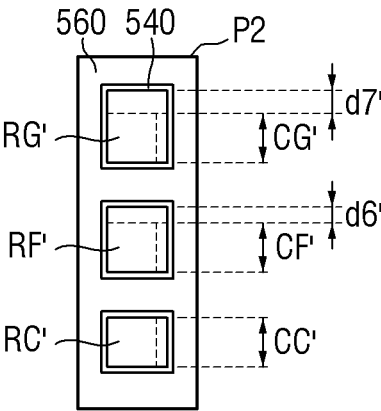
FIG. 8 is a diagram schematically showing layout data used in a portion of FIG. 2 to form a semiconductor memory device according to some embodiments.
Figure 9:
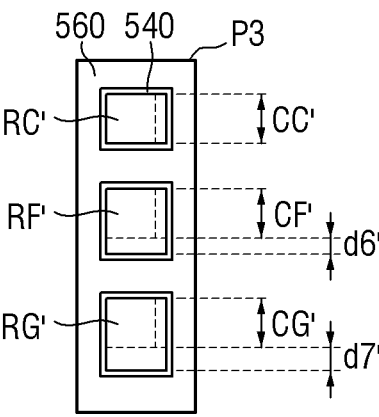
FIG. 9 is a diagram schematically showing layout data used in a portion of FIG. 2 to form a semiconductor memory device according to some embodiments.

FIG. 6 is a diagram schematically showing layout data used in a portion P1 of FIG. 2 to form a semiconductor memory device according to some embodiments. FIG. 7 is a diagram schematically showing layout data used in the portion P1 of FIG. 2 to form a semiconductor memory device according to some embodiments, and is a diagram corresponding to FIG. 6. FIG. 8 is a diagram schematically showing layout data used in a portion P2 of FIG. 2 to form a semiconductor memory device according to some embodiments. FIG. 9 is a diagram schematically showing layout data used in a portion P3 of FIG. 2 to form a semiconductor memory device according to some embodiments.

FIG. 6 to FIG. 9 are diagrams showing layout data for forming the storage node SN of FIG. 2, that is, the first to fifth storage patterns 520A, 520B, 520C, 520D, and 520E of FIG. 5.

The layout data includes data about a plurality of target patterns and a plurality of corrected patterns RA, RB, RC, RD, RE, RC', RF', and RG' obtained by correcting critical dimensions of the plurality of target patterns. Specifically, the data on the plurality of corrected patterns RA, RB, RC, RD, RE, RC', RF', and RG' may refer to data obtained by gradually changing the critical dimensions CA, CB, CC, CD, and CE of the plurality of target patterns in a relative manner to each other along one direction opposite to a direction of an external force to the first to fifth storage patterns 520A, 520B, 520C, 520D, and 520E.

In one example, FIGS. 6-7 and 8-9 show only five and three corrected patterns, respectively. However, this is only illustrative, and each of the number of the target patterns and the number of the corrected patterns is not limited thereto.

In this case, change amounts d1, d2, d3, and d4 in the critical dimensions CA, CB, CC, CD, and CE in the first direction X of the plurality of target patterns may be different from each other depending on positions on the substrate 110 where the first to fifth storage patterns 520A, 520B, 520C, 520D, and 520E are formed. Accordingly, change amounts in areas of the top faces of the plurality of target patterns may also be different from each other based on the positions on the substrate 110 where the first to fifth storage patterns 520A, 520B, 520C, 520D, and 520E are to be formed.

Referring to FIG. 6, the change amounts d1, d2, d3, and d4 in the first direction X in the critical dimensions CA, CB, CC, CD, and CE of the target patterns may gradually increase in a relative manner to each other along the first direction X. The change amounts d1, d2, d3, and d4 in the critical dimensions CA, CB, CC, CD, and CE in the first direction X of the target patterns may gradually increase in a relative manner to each other as the patterns are closer to the peripheral area PR. Accordingly, change amounts in the areas of the top faces of the target patterns may gradually increase in a relative manner to each other along the first direction X. The change amounts in the areas of the top faces of the target patterns may gradually increase in a relative manner to each other as the patterns are closer to the peripheral area PR.

Referring to FIG. 7, unlike FIG. 5, the change amounts d1, d2, d3, and d4 in the critical dimensions CA, CB, CC, CD, and CE in the first direction X of the target patterns may gradually increase in a relative manner to each other along a direction parallel to and opposite to the first direction X. The change amounts d1, d2, d3, and d4 in the critical dimensions CA, CB, CC, CD, and CE in the first direction X of the target patterns may gradually increase in a relative manner to each other as the patterns are closer to the cell block area SCB. Accordingly, the change amounts in the areas of the top faces of the target patterns may gradually increase in a relative manner to each other along the direction parallel to and opposite to the first direction X. The change amounts in the areas of the top faces of the target patterns may gradually increase in a relative manner to each other as the patterns are closer to the cell block area SCB.

Referring to FIG. 8, change amounts d6' and d7' in the critical dimensions CC', CF', and CG' in the second direction Y of the target patterns may gradually increase in a relative manner to each other along the second direction Y. The change amounts d6' and d7' in the critical dimensions CC', CF', and CG' in the second direction Y of the target patterns may gradually increase in a relative manner to each other as the patterns are closer to the peripheral area PR. Accordingly, change amounts in the areas of the top faces of the target patterns may gradually increase in a relative manner to each other along the second direction Y. The change amounts in the areas of the top faces of the target pattern may gradually increase in a relative manner to each other as the patterns are closer to the peripheral area PR.

Referring to FIG. 9, the change amounts d6' and d7' in the critical dimensions CC', CF', and CG' in the second direction Y of the target patterns may increase in a relative manner to each other in a direction parallel to the second direction Y and opposite thereto. The change amounts d6' and d7' in the critical dimensions CC', CF', and CG' in the second direction Y of the target patterns may gradually increase in a relative manner to each other as the patterns are closer to the cell block area SCB. Accordingly, the change amounts in the areas of the top faces of the target patterns may gradually increase in a relative manner to each other along a direction parallel to and opposite to the second direction Y. Accordingly, the change amounts in the areas of the top faces of the target patterns may gradually increase in a relative manner to each other as the patterns are closer to the cell block area SCB.

In order to obtain improved performance within the allowed cell area, structures such as capacitors may be formed to have a high aspect ratio. When these structures are arranged in a form of a plurality of arrays, an external force acting in a direction from an outer area of the array toward an inner area thereof may be applied to the structures. In this case, there is a problem that the structures having the high aspect ratio may be bent.

According to some embodiments, the critical dimensions of the structures having the high aspect ratio may gradually increase or decrease in a relative manner to each other in one direction opposite to a direction in which the external force is applied. Accordingly, cross-sectional areas of the structures may be gradually increased or decreased in a relative manner to each other in one direction opposite to a direction in which the external force is applied. That is, a position of a center of gravity of each of the structures may be displaced on the cross-sectional area of the structure and along one direction. Thus, the bending phenomenon may be minimized.

In one example, the external force may be generated for various reasons. Thus, the direction in which the external force acts is also not limited to the aforementioned direction. For example, the external force may be applied to the structures in a direction from the inner area of the array toward the outer area thereof. Even in this case, the cross-sectional areas of the structures may increase or decrease in a relative manner to each other in one direction opposite to a direction in which the external force is applied, such that the aforementioned bending phenomenon may be minimized.

Figure 10:
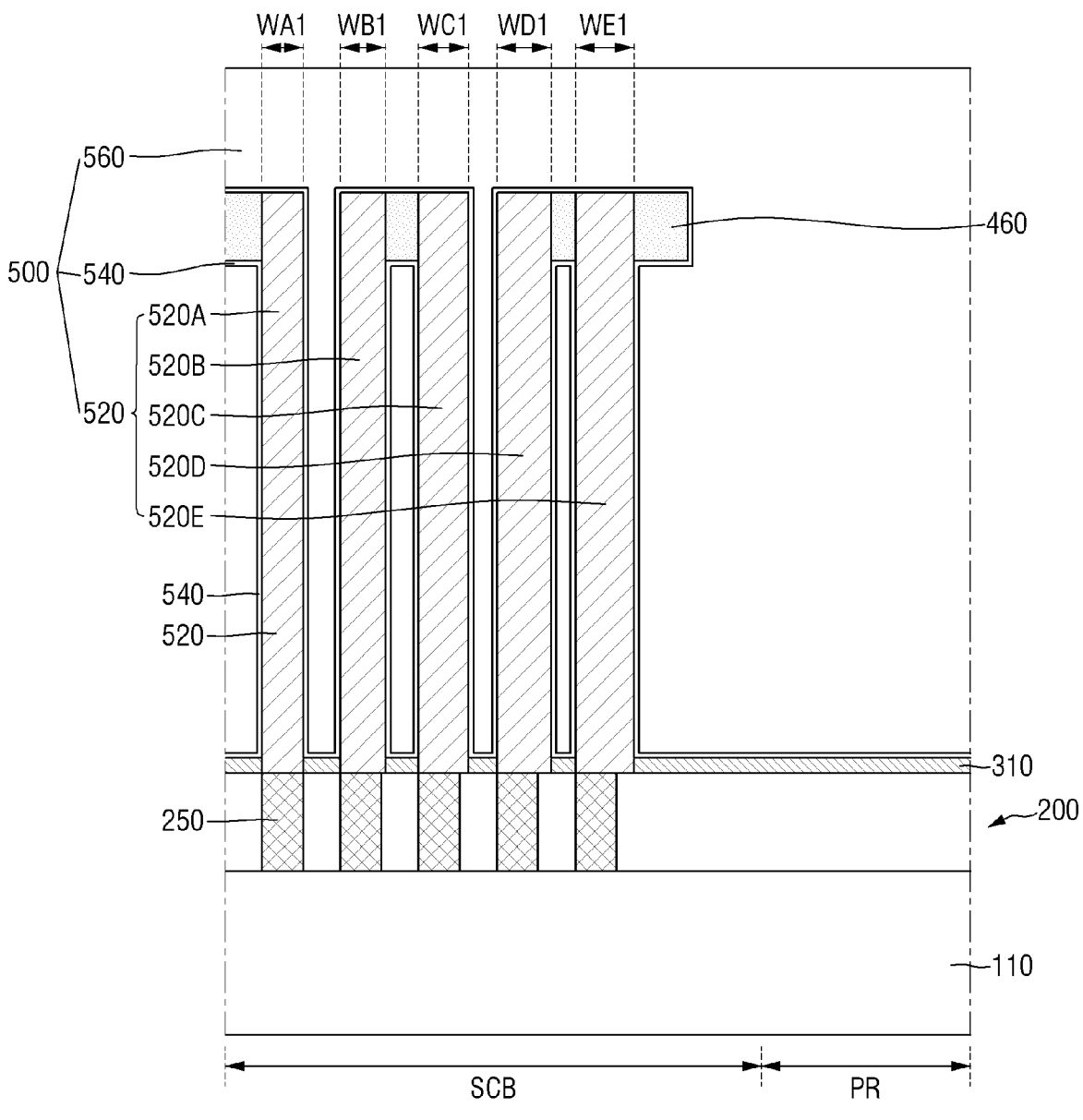
FIG. 10 is a cross-section diagram illustrating main components of a semiconductor memory device according to other embodiments.
Figure 11:
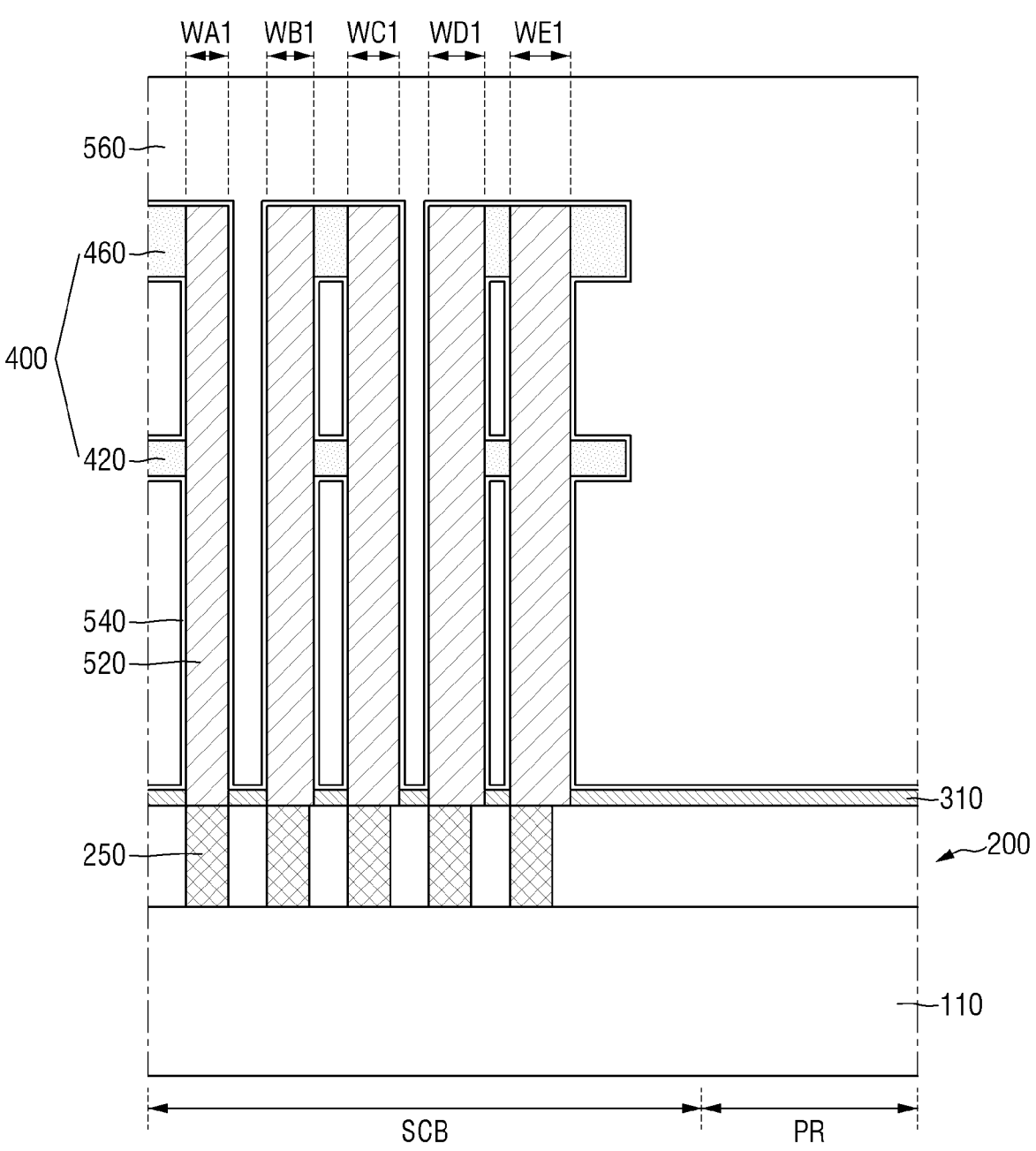
FIG. 11 is a cross-section diagram showing main components of a semiconductor memory device according to still further embodiments.

FIG. 10 is a cross-section diagram illustrating main components of a semiconductor memory device according to other embodiments. FIG. 11 is a cross-section diagram showing main components of a semiconductor memory device according to still further embodiments. For the convenience of description, the descriptions of the same contents as described above with reference to FIG. 1 to FIG. 9 may be omitted.

Referring to FIG. 10, the semiconductor memory device may further include an upper support pattern 460 in contact with at least a portion of a sidewall of each of the first to fifth storage patterns 520A, 520B, 520C, 520D, and 520E so as to support each of the first to fifth storage patterns 520A, 520B, 520C, 520D, and 520E.

Widths WA1, WB1, WC1, WD1, and WE1 in the first direction of the top faces of the first to fifth storage patterns 520A, 520B, 520C, 520D, and 520E may gradually increase in a relative manner to each other along one direction. Further, the spacings in the first direction between the first to fifth storage patterns 520A, 520B, 520C, 520D, and 520E may be gradually decreased in a relative manner to each other along one direction.

Referring to FIG. 11, the support pattern 400 may include a lower support pattern 420 and an upper support pattern 460. The support pattern 400 may prevent the storage structures 500 of a shape of a pillar from collapsing. The support pattern 400 may include silicon nitride (SiN) or silicon carbonitride (SiCN).

In one example, positions and the number of the lower support pattern 420 and the upper support pattern 460 may not be limited to those shown in FIG. 10 and FIG. 11.

FIG. 12 to FIG. 19 are diagrams of intermediate structures of steps for illustrating a method of manufacturing a semiconductor memory device according to some embodiments. For the convenience of description, the descriptions of the same contents as described above with reference to FIG. 1 to FIG. 11 may be omitted.

Figure 12:
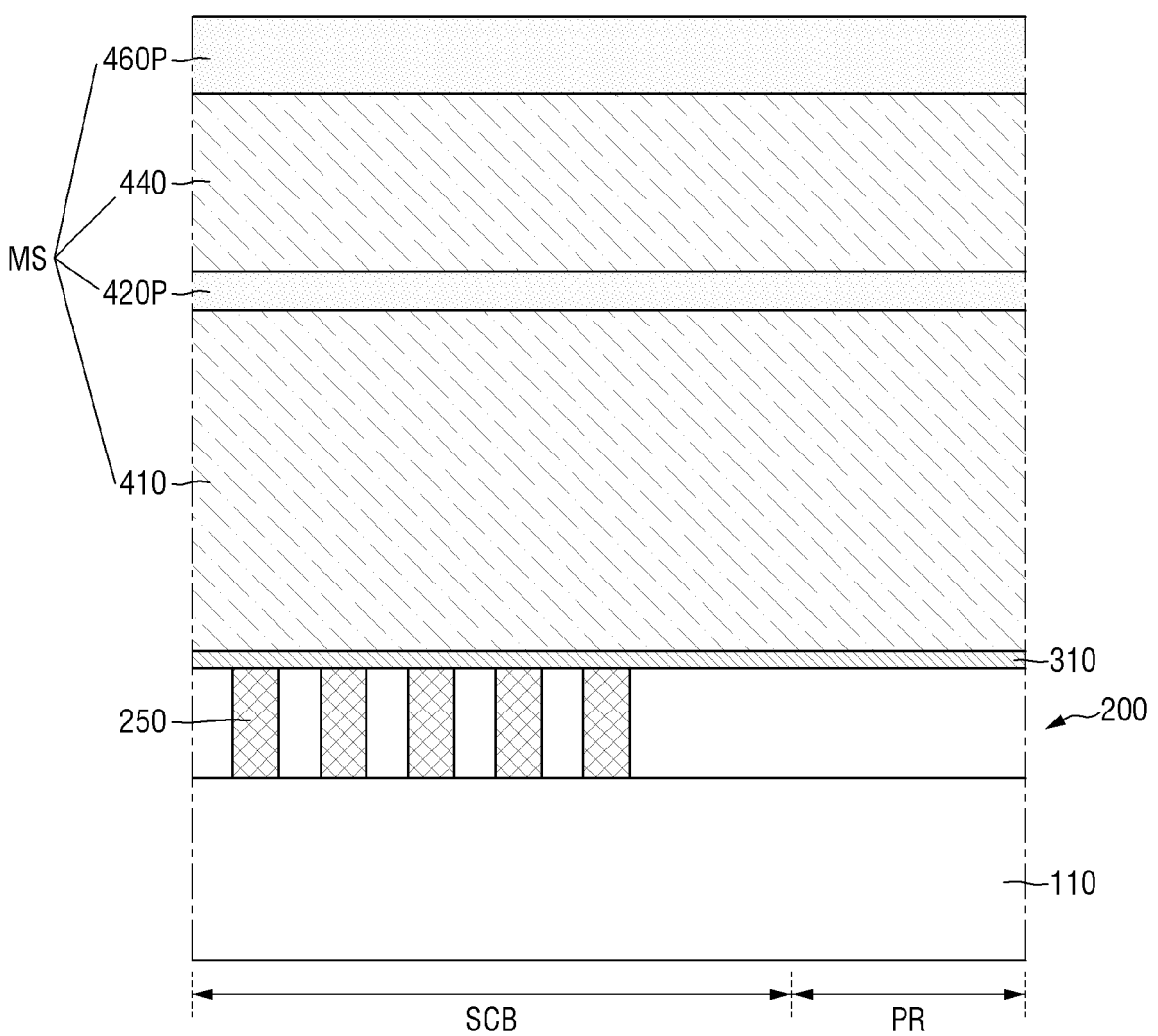
FIG. 12 is a first diagram of intermediate structures of steps for illustrating a method of manufacturing a semiconductor memory device according to some embodiments.

Referring to FIG. 12, the lower structure 200 and the plurality of contact plugs 250 extending through the lower structure 200 and connected to the substrate 110 are formed on the substrate 110 including the cell block area SCB and the peripheral area PR.

Although not specifically shown, the cell contact plug as described above may be electrically connected to cell impurity areas in the cell block area SCB, and the aforementioned peripheral contact plug may be electrically connected to peripheral impurity areas in the peripheral area PR. In this case, the cell impurity area may act as a source or a drain of a cell transistor formed in the cell block area SCB. The peripheral impurity area may act as a source or a drain of a peripheral transistor formed in the peripheral area PR.

Thereafter, the etch stop film 310 covering the lower structure 200 and the plurality of contact plugs 250, a first mold layer 410, a lower support layer 420P, a second mold layer 440 and an upper support layer 460P are sequentially stacked to form a mold structure MS.

Each of the first mold layer 410 and the second mold layer 440 may include silicon oxide. Each of the lower support layer 420P and the upper support layer 460P may be made of an insulating material having etch selectivity relative to a material of each of the first mold layer 410 and the second mold layer 440. For example, each of the lower support layer 420P and the upper support layer 460P may include silicon nitride (SiN) or silicon carbonitride (SiCN). The etch stop film 310 may include an insulating material having etch selectivity relative to a material of the first mold layer 410, and may include, for example, silicon nitride (SiN) or silicon carbonitride (SiCN).

Figure 13:
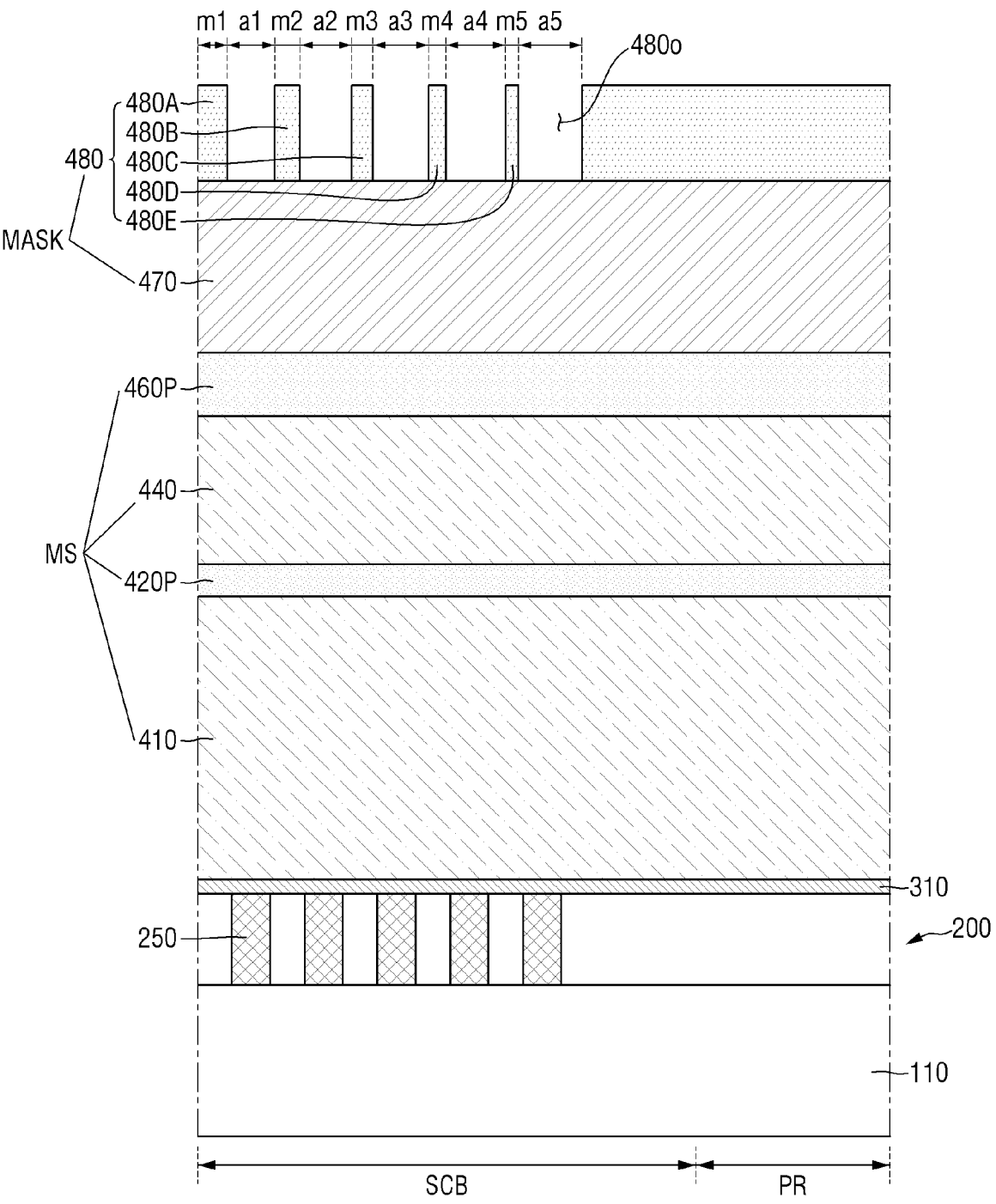
FIG. 13 is a second diagram of intermediate structures of steps for illustrating the method of manufacturing the semiconductor memory device according to some embodiments.

Referring to FIG. 13, a mask structure MASK may be formed on the mold structure MS. Forming the mask structure MASK may include forming a first mask layer 470 on the mold structure MS, and forming a second mask layer 480 on the first mask layer 470.

The first mask layer 470 may be a mask layer for patterning the mold structure MS. The first mask layer 470 may include polysilicon. The second mask layer 480 may be a mask layer for patterning the first mask layer 470. The second mask layer 480 may be made of silicon oxide or Spin On Hardmask (SOH). However, the materials of the first mask layer 470 and the second mask layer 480 are not limited thereto and may be replaced with other materials.

The second mask layer 480 may include first to fifth mask patterns 480A, 480B, 480C, 480D, and 480E. The first to fifth mask patterns 480A, 480B, 480C, 480D, and 480E may be formed based on the above-described corrected patterns RA, RB, RC, RD, and RE. In this case, widths m1, m2, m3, m4, and m5 along the first direction X of the first to fifth mask patterns 480A, 480B, 480C, 480D, and 480E may be gradually decreased in a relative manner to each other as the patterns are closer to the peripheral area PR.

The second mask layer 480 may have mask openings, that is, second mask openings 480o exposing the first mask layer 470 on the cell block area SCB. In this case, spacings a1, a2, a3, a4, and a5 in the first direction X between the first to fifth mask patterns 480A, 480B, 480C, 480D, and 480E may be gradually increased in a relative manner to each other as the patterns are closer to the peripheral area PR.

Figure 14:
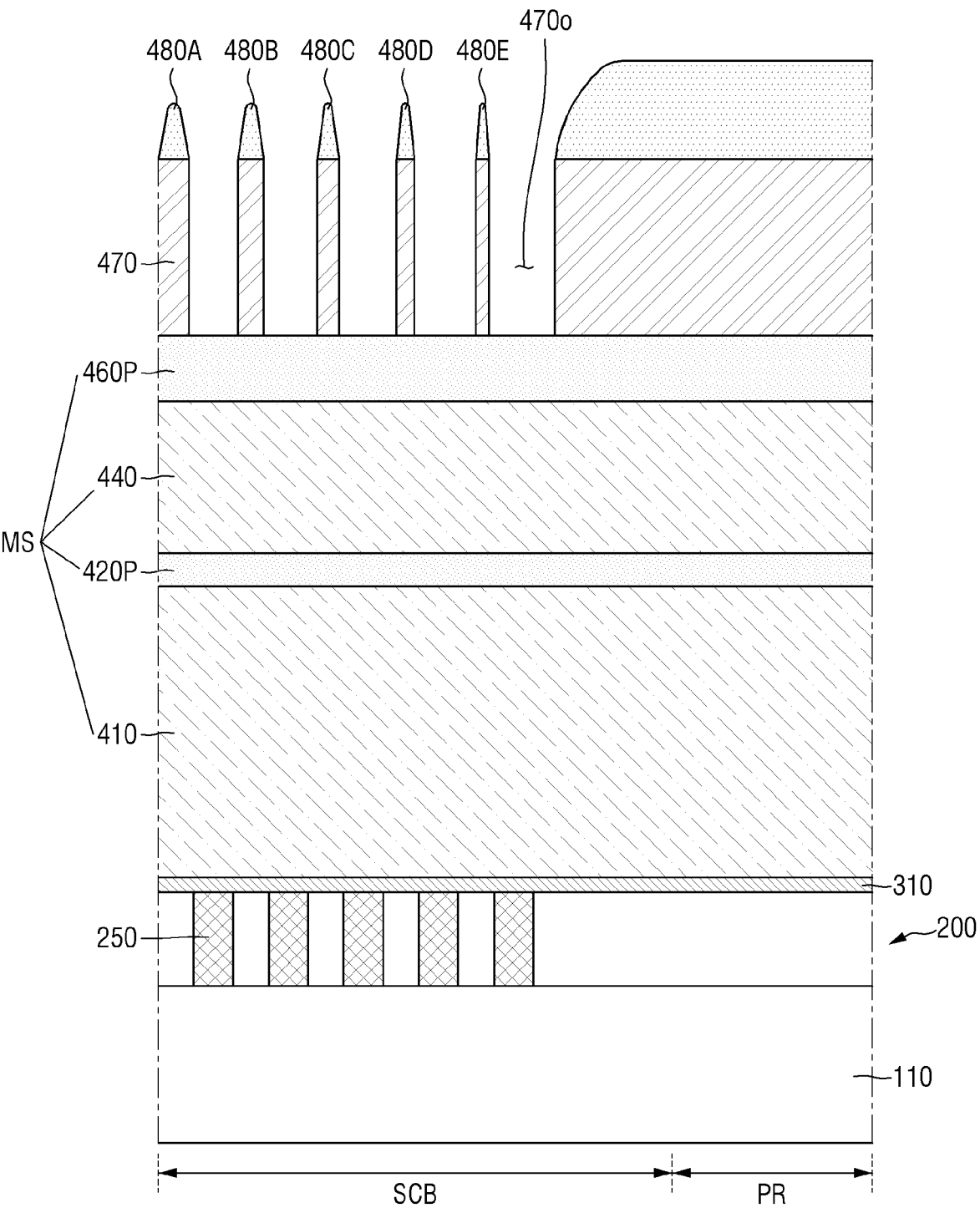
FIG. 14 is a third diagram of intermediate structures of steps for illustrating the method of manufacturing the semiconductor memory device according to some embodiments.

Referring to FIG. 14, in an etching process using the second mask layer 480 as an etching mask, portions of the first mask layer 470 exposed through the second mask openings 480o may be etched to form first mask openings 470o extending through the first mask layer 470 and exposing the mold structure MS.

For example, in the above-described etching process, a portion of the second mask layer 480 positioned on the cell block area SCB may be formed in a shape in which a width thereof becomes smaller as it extends upwardly.

Figure 15:
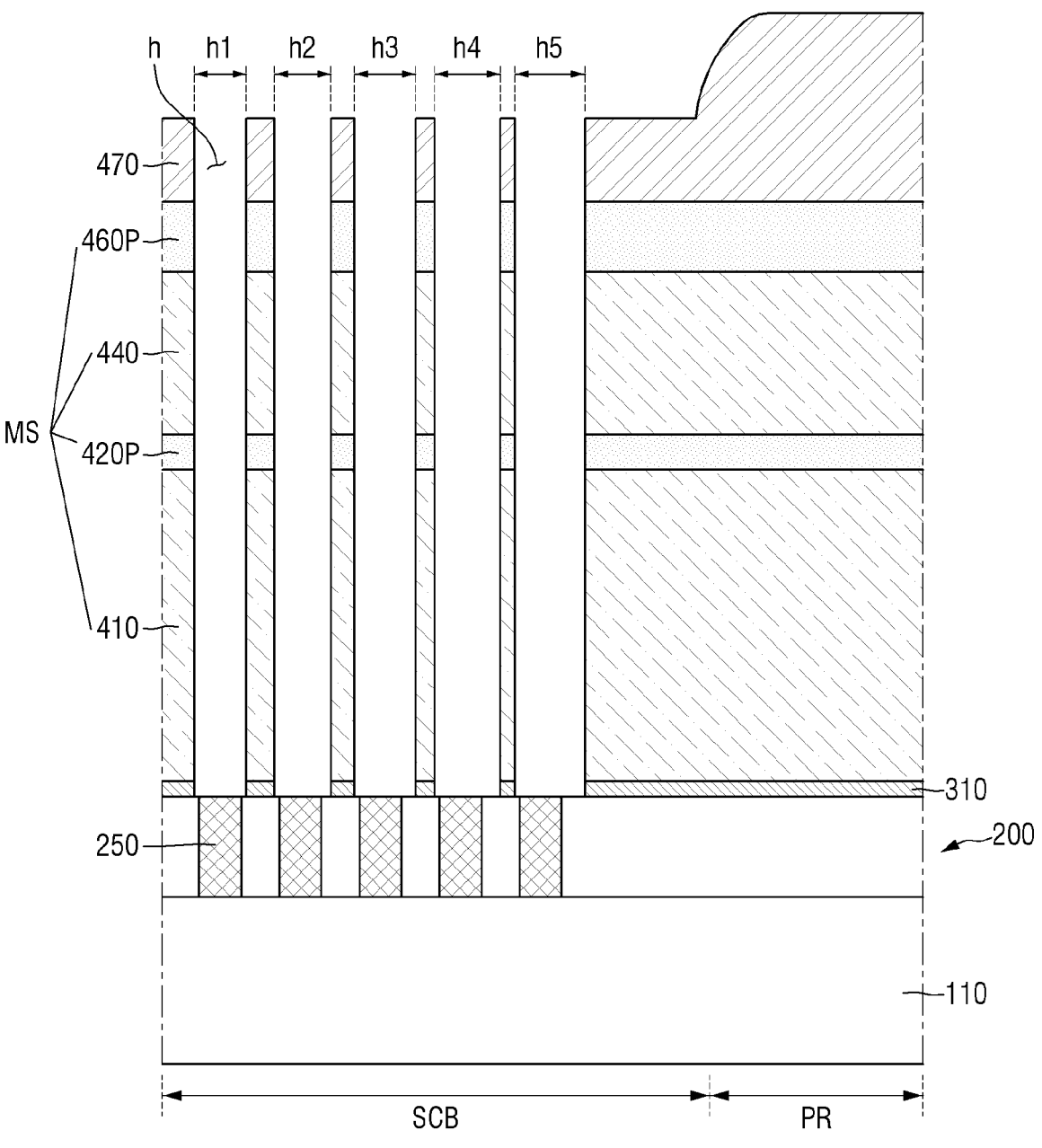
FIG. 15 is a fourth diagram of intermediate structures of steps for illustrating the method of manufacturing the semiconductor memory device according to some embodiments.

Referring to FIG. 15, in an etching process using the first mask layer 470 as an etching mask, portions of the mold structure MS exposed through the first mask openings 470o may be etched to form holes h exposing the contact plugs 250. In this case, widths h1, h2, h3, h4, and h5 along the first direction X of the holes h may increase in a relative manner to each other as the patterns are closer to the peripheral area PR.

Figure 16:
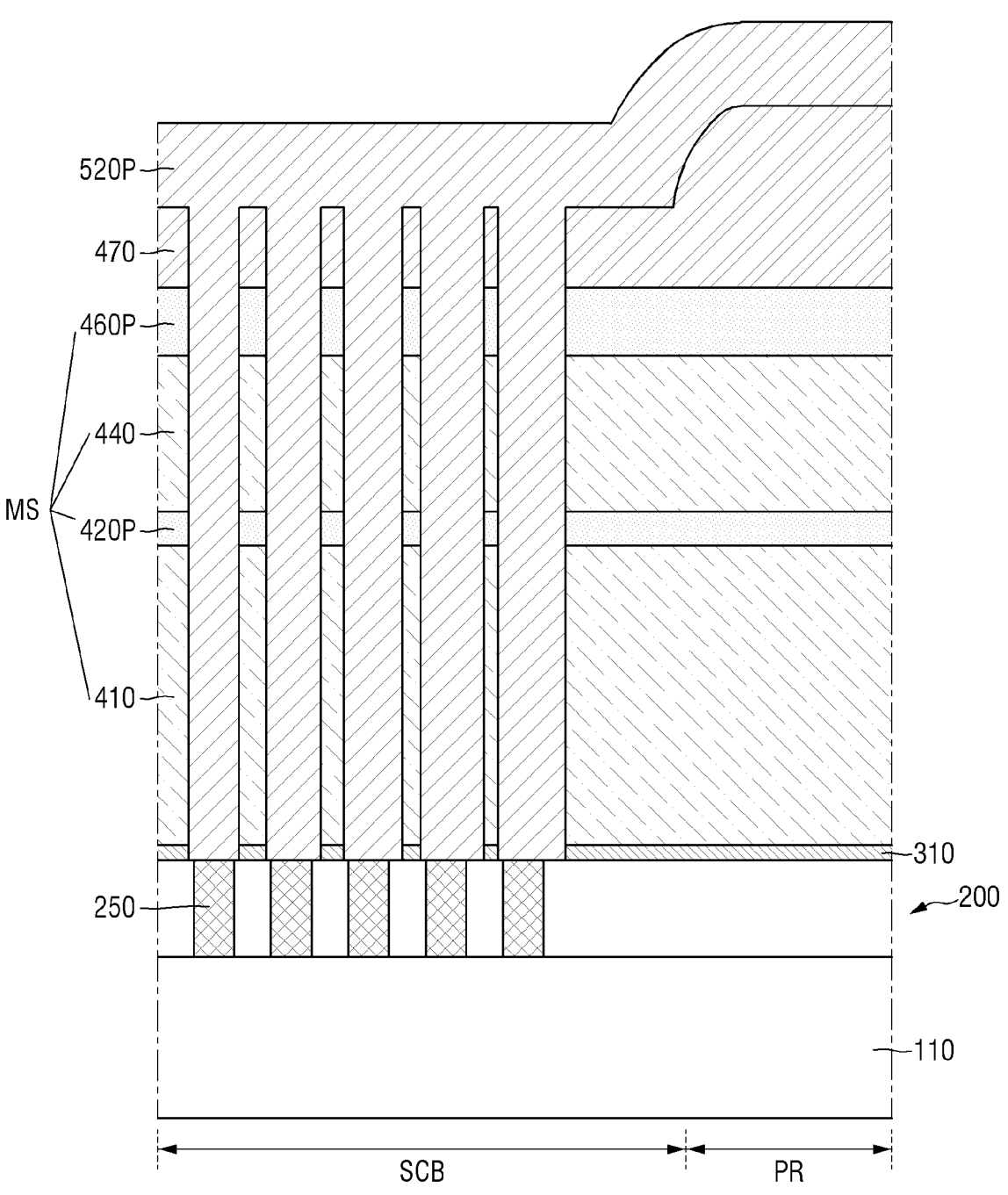
FIG. 16 is a fifth diagram of intermediate structures of steps for illustrating the method of manufacturing the semiconductor memory device according to some embodiments.

Referring to FIG. 16, a conductive material layer 520P covering the first mask layer 470 while filling the holes h of the mold structure MS and the first mask openings 470o of the first mask layer 470 may be formed. The conductive material layer 520P may include a conductive material such as metal, metal nitride, metal oxide, metal silicide, conductive carbon, or a combination thereof.

Figure 17:
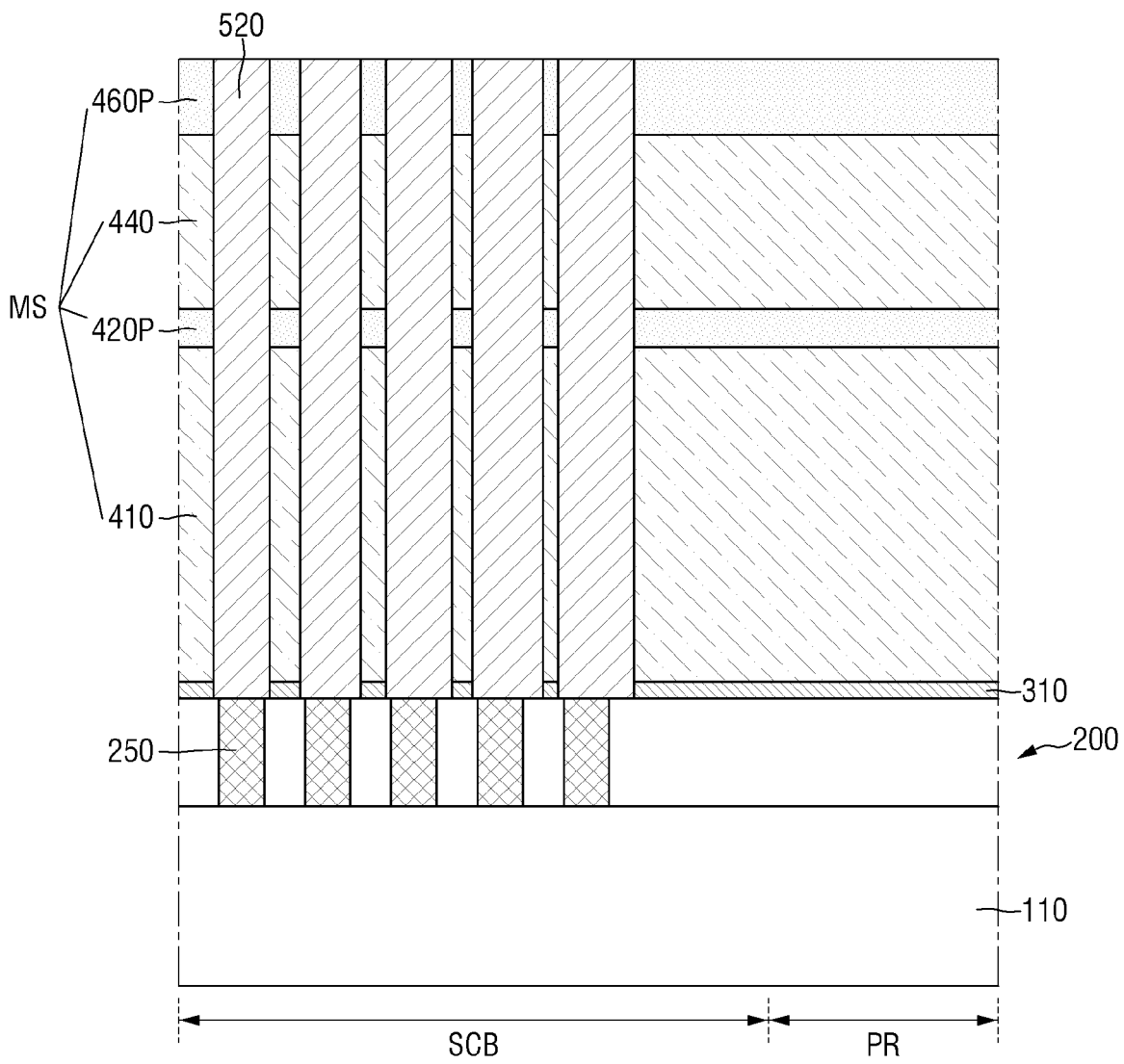
FIG. 17 is a sixth diagram of intermediate structures of steps for illustrating the method of manufacturing the semiconductor memory device according to some embodiments.

Referring to FIG. 17, the lower electrode 520 may be formed in the holes h by etching the conductive material layer 520P and performing a chemical mechanical polishing process to expose the upper support layer 460P.

Figure 18:
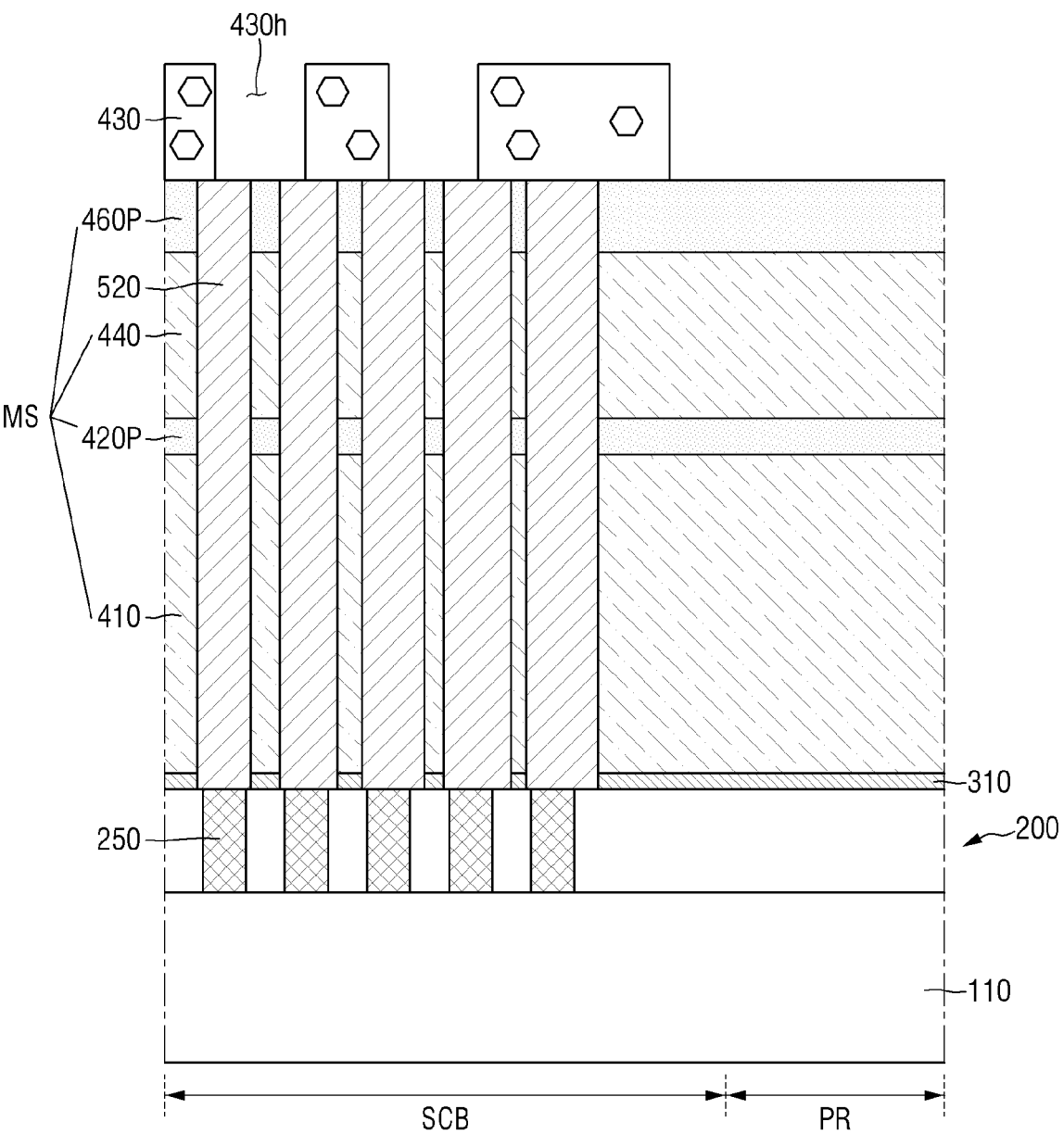
FIG. 18 is an seventh diagram of intermediate structures of steps for illustrating the method of manufacturing the semiconductor memory device according to some embodiments.

Referring to FIG. 18, a mask 430 may be formed on the mold structure MS. The mask 430 may be a mask for forming the plurality of the support pattern 400. The mask 430 may cover a portion of the upper support layer 460P on the cell block area SCB. The mask 430 may have mask openings 430h defined therein. A portion of the upper support layer 460P and a portion of the lower electrode 520 on the cell block area SCB may be exposed through the mask openings 430h of the mask 430.

Figure 19:
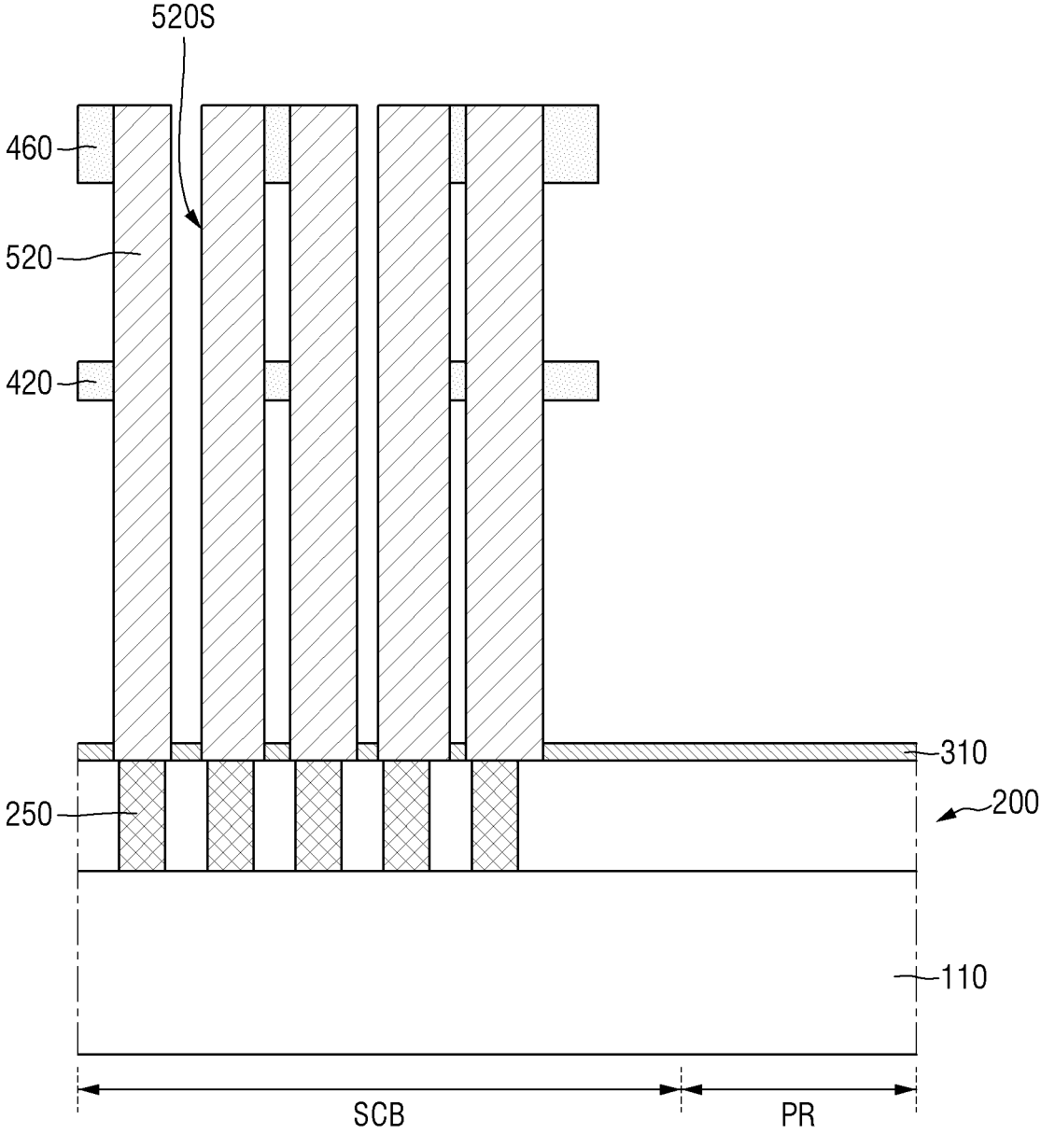
FIG. 19 is a eighth diagram of intermediate structures of steps for illustrating the method of manufacturing the semiconductor memory device according to some embodiments.

Referring to FIG. 19, the mold structure MS may be etched in an etching process using the mask 430 as an etching mask. The mask 430 may be removed after the mold structure MS has been etched or while the mold structure MS is being etched. For example, using the mask 430 as an etching mask, the upper support layer 460P of the mold structure MS may be etched to form the upper support pattern 460 while exposing a portion of the second mold layer 440. Then, the second mold layer 440 may be etched to expose the lower support layer 420P. The lower support layer 420P may be etched to form the lower support pattern 420 while exposing the first mold layer 410. The first mold layer 410 may be etched.

Sidewalls 520S of the lower electrode 520 may be exposed after the etching process of the upper support pattern 460 and the lower support pattern 420.

Then, referring to FIG. 11, the capacitor dielectric film 540 is conformally formed on the lower support pattern 420, the upper support pattern 460, and the lower electrode 520 formed on the substrate 110. The upper electrode 560 filling a space between a plurality of the lower electrode 520 and covering the upper support pattern 460 may be formed on the capacitor dielectric film 540.

Figure 20:
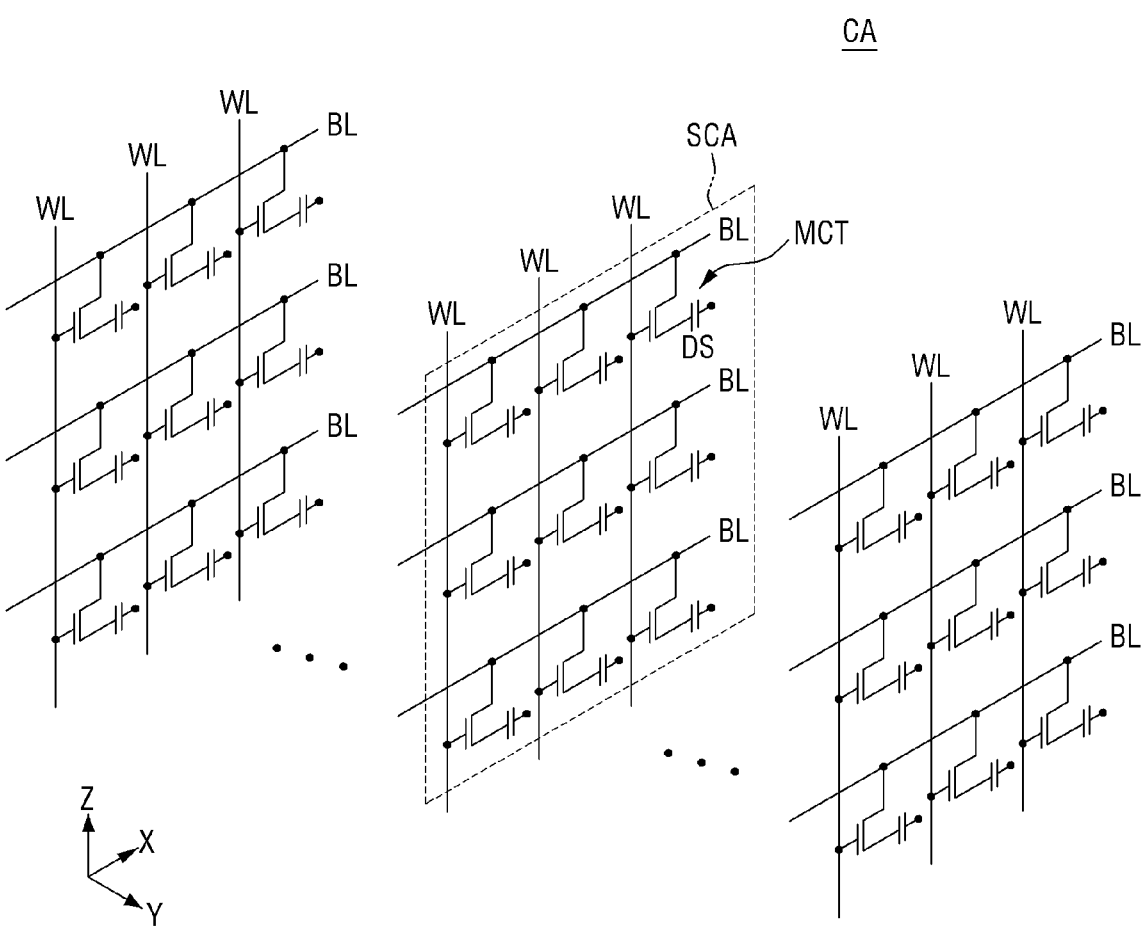
FIG. 20 is a simplified circuit diagram showing a cell array of a three-dimensional semiconductor memory device according to some embodiments.
Figure 21:
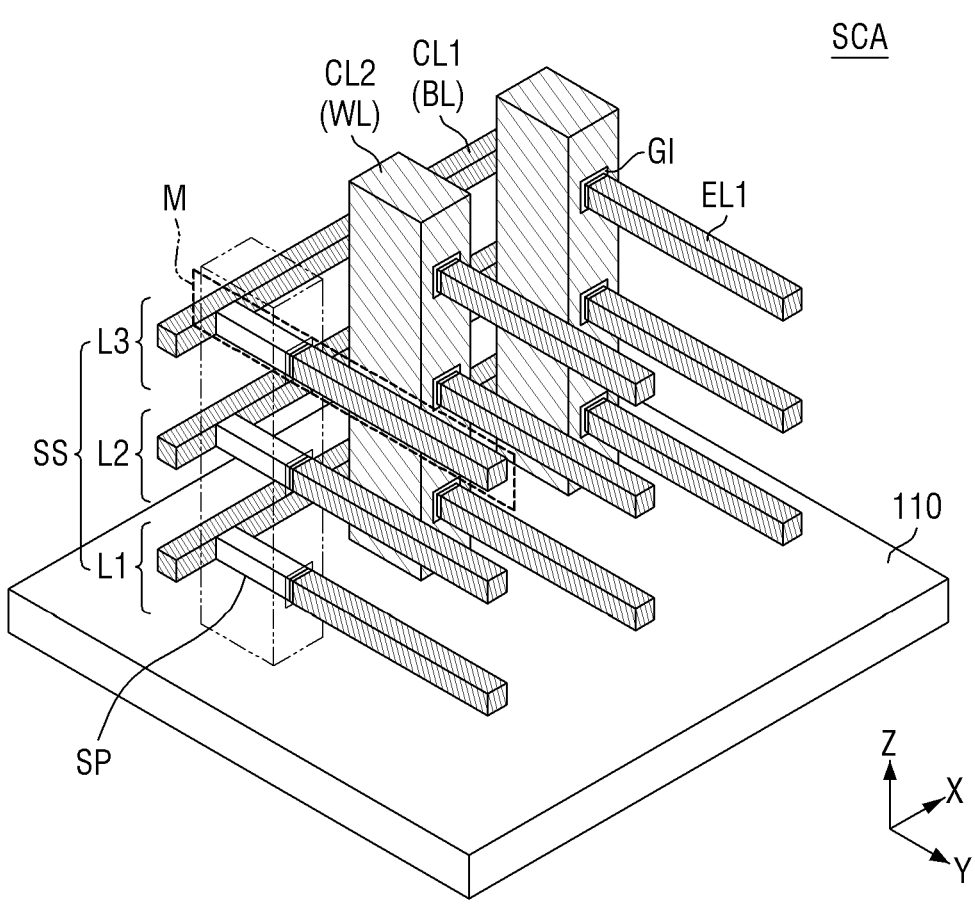
FIG. 21 is an illustrative perspective view showing a semiconductor memory device according to an embodiment.
Figure 22:
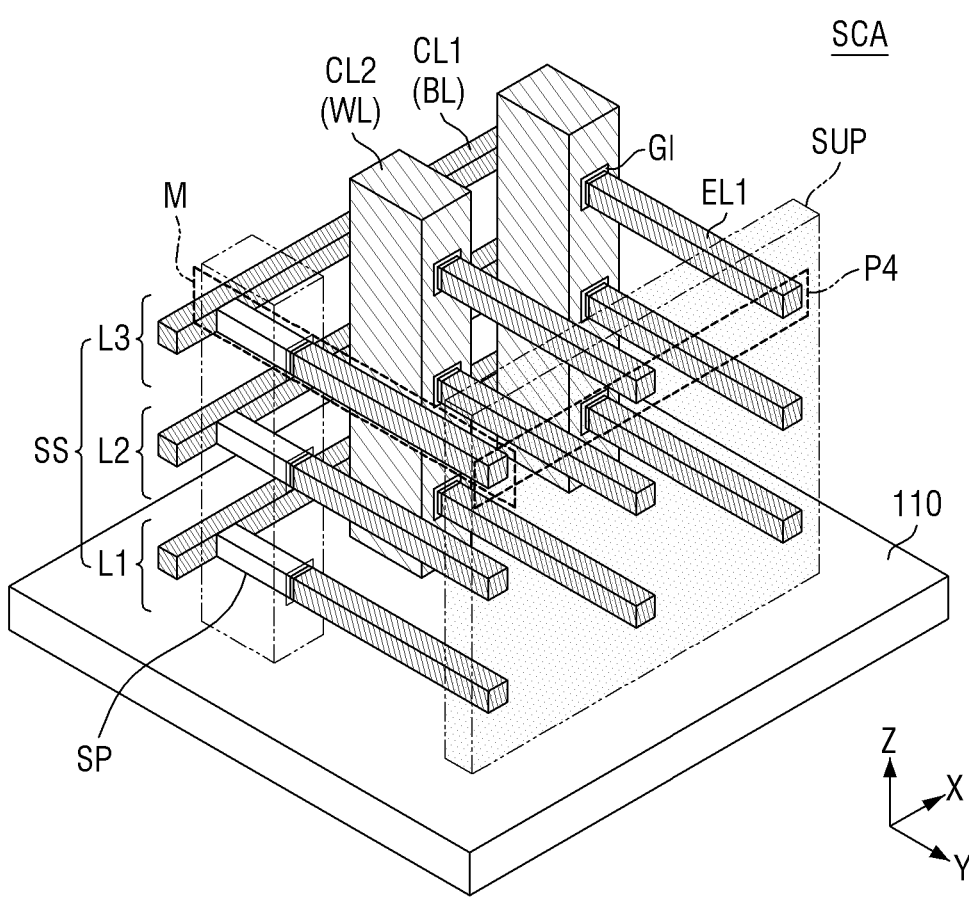
FIG. 22 is an illustrative perspective view showing a semiconductor memory device according to an embodiment.
Figure 23:
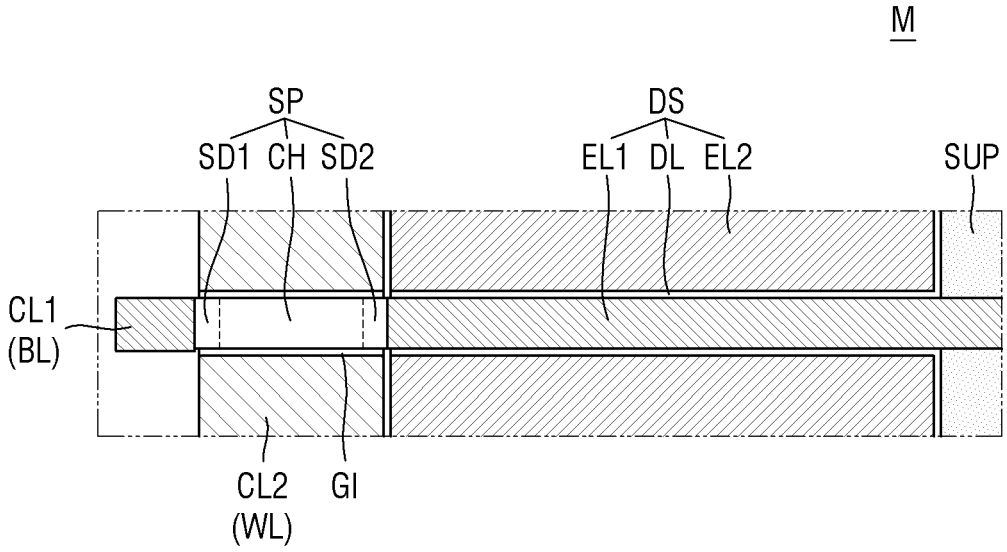
FIG. 23 is an enlarged view of an area of FIG. 22.

FIG. 20 is a simplified circuit diagram showing a cell array of a three-dimensional semiconductor memory device according to some embodiments. FIG. 21 to FIG. 22 are illustrative perspective views showing a semiconductor memory device according to some embodiments, respectively. FIG. 23 is an enlarged view of an area M of FIG. 22. For the convenience of description, the descriptions of the same contents as described above with reference to FIG. 1 to FIG. 11 may be omitted.

Referring to FIG. 20, a cell array CA of the three-dimensional semiconductor memory device according to some embodiments may include a plurality of sub-cell arrays SCA. The cell arrays CA are included in the cell block area SCB of FIG. 1. The sub-cell arrays SCA may be included in the cell array CA. The sub-cell arrays SCA may be arranged along the second direction Y.

Each of the sub-cell arrays SCA may include a plurality of bit-lines BL, a plurality of word-lines WL, and a plurality of memory cell transistors MCT. One of the memory cell transistors MCT may be disposed between one of the word-lines WL and one of the bit-lines BL.

The bit-lines BL may be conductive patterns (e.g., metal lines) which may be spaced apart from the substrate 110 and disposed above the substrate 110. The bit-lines BL may extend in the first direction X. The bit-lines BL in one of the sub-cell arrays SCA may be spaced apart from each other in the vertical direction, that is, the third direction Z. The word-lines WL may be conductive patterns (e.g., metal lines) extending in a direction perpendicular to the substrate, that is, the third direction Z. The word-lines WL in one of the sub-cell arrays SCA may be spaced apart from each other in the first direction X.

A gate of one of the memory cell transistors MCT may be connected to one of the word-lines WL, and a source of the one of the memory cell transistors MCT may be connected to one of the bit-lines BL. Each of the memory cell transistors MCT may include a storage structure DS including a capacitor. For example, a drain of the one of the memory cell transistors MCT may be connected to the storage structure DS.

Referring to FIG. 21, one of the plurality of sub-cell arrays SCA shown in FIG. 20 may be disposed on the substrate 110. The substrate 110 may be a silicon substrate, a germanium substrate, or a silicon-germanium substrate.

Specifically, a stack structure SS including first to third layers L1, L2, and L3 may be disposed on the substrate 110. The first to third layers L1, L2, and L3 of the stack structure SS may be stacked while being spaced apart from each other in the vertical direction, that is, the third direction Z. Each of the first to third layers L1, L2, and L3 may include a plurality of semiconductor patterns SP, a plurality of first electrodes EL1, and a first conductive line CL1.

Each of the semiconductor patterns SP may have a line shape, a bar shape, or a column shape extending from each first conductive line CL1 in the second direction Y. In one example, each of the semiconductor patterns SP may include silicon, germanium or silicon-germanium. Each of the semiconductor patterns SP may include a channel area CH, a first impurity area SD1, and a second impurity area SD2.

Referring to FIG. 21 and FIG. 23, the channel area CH may be interposed between the first impurity area SD1 and the second impurity area SD2. The channel area CH may correspond to a channel of the one of the memory cell transistors MCT shown in FIG. 20. The first impurity area SD1 and the second impurity area SD2 may correspond to the source and the drain of the one of the memory cell transistors MCT shown in FIG. 20, respectively. Each of the first impurity area SD1 and the second impurity area SD2 may be an area in which impurities are doped into one of the semiconductor patterns SP. Accordingly, each of the first impurity area SD1 and the second impurity area SD2 may have an n-type or p-type conductivity.

The first electrodes EL1 may be respectively connected to one ends of the semiconductor patterns SP. That is, the first electrodes EL1 may be respectively connected to the second impurity area SD2 of the semiconductor patterns SP. Each of the first electrodes EL1 may extend horizontally in the second direction Y from each of the semiconductor patterns SP. Each of the first electrodes EL1 may have a line shape, a bar shape, or a column shape.

The first conductive line CL1 may have a line shape or a bar shape extending in the first direction X. The first conductive line CL1 may be provided in plural and stacked so as to be spaced apart from each other along the third direction Z. Each of the first conductive line CL1 may include conductive material. In one example, the conductive material may include one of a doped semiconductor material (e.g., doped silicon, doped germanium, etc.), a conductive metal nitride (e.g., titanium nitride, tantalum nitride, etc.), metal (e.g., tungsten, titanium, tantalum, etc.), a metal-semiconductor compound (e.g., tungsten silicide, cobalt silicide, titanium silicide), and the like. The plurality of the first conductive line CL1 may act as the bit-lines BL as described with reference to FIG. 20.

Among the first to third layers L1, L2, and L3, the first layer L1 will be described in detail by way of example. The semiconductor patterns SP of the first layer L1 may be arranged so as to be spaced apart from each other in the first direction X. The semiconductor patterns SP of the first layer L1 may be positioned at the same first level. The first conductive line CL1 of the first layer L1 may be connected to each first impurity area SD1 of the semiconductor patterns SP of the first layer L1. That is, the first conductive line CL1 of the first layer L1 connects a plurality of the first impurity area SD1 to each other and may extend in the first direction X.

The first electrodes EL1 of the first layer L1 may horizontally extend in the second direction Y from the semiconductor patterns SP of the first layer L1. The first electrodes EL1 of the first layer L1 may be arranged so as to be spaced apart from each other in the first direction X. The first electrodes EL1 of the first layer L1 may be positioned at the same first level. Each of the first electrodes EL1 may include a conductive material, and the conductive material may be one of a doped semiconductor material, a conductive metal nitride, a metal, and a metal-semiconductor compound. Each of the first electrodes EL1 may include substantially the same material as that of the first conductive line CL1.

A detailed description of each of the second layer L2 and the third layer L3 may be substantially the same as that of the first layer L1 as set forth above. The first conductive line CL1, the semiconductor patterns SP, and the first electrodes EL1 of the second layer L2 may be positioned at a second level higher than the first level. The first conductive line CL1, the semiconductor patterns SP, and the first electrodes EL1 of the third layer L3 may be positioned at a third level higher than the second level.

A dielectric film DL covering surfaces of the first electrodes EL1 of the stack structure SS may be provided. The dielectric film DL may have a uniform thickness on and along the surface of the first electrodes EL1. For example, the dielectric film DL may include at least one of metal oxides such as hafnium oxide, zirconium oxide, aluminum oxide, lanthanum oxide, tantalum oxide, and titanium oxide.

A second electrode EL2 may be disposed on the dielectric film DL. The second electrode EL2 may surround the first electrodes EL1. The second electrode EL2 may include a conductive material, and the conductive material may be one of a doped semiconductor material, a conductive metal nitride, a metal, and a metal-semiconductor compound. Each of the first electrodes EL1, the dielectric film DL, and the second electrode EL2 may constitute the storage structure DS. The storage structure DS may act as a memory element that may store data therein and may correspond to at least one of the storage structures 500 in FIG. 5.

Second conductive lines CL2 extending through the stack structure SS may be disposed on the substrate 110. Each of the second conductive lines CL2 may have a line shape, a bar shape, or a column shape extending in the third direction Z. The second conductive lines CL2 may be arranged so as to be spaced apart from each other in the first direction X. Each of the second conductive lines CL2 may include a conductive material, and the conductive material may be one of a doped semiconductor material, a conductive metal nitride, a metal, and a metal-semiconductor compound. The second conductive lines CL2 may act as the word-lines WL as described with reference to FIG. 1.

A gate insulating film GI may be interposed between at least one of the second conductive lines CL2 and at least one of the semiconductor patterns SP. In other words, the memory cell transistors MCT according to some embodiments may be embodied as a gate all around transistor.

The gate insulating film GI may include a single film selected from a high dielectric constant film, a silicon oxide film, a silicon nitride film, and a silicon oxynitride film, or a combination thereof. For example, the high dielectric constant film may be made of at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Although not specifically illustrated, empty spaces in the stack structure SS may be filled with an insulating material. For example, the insulating material may include at least one of a silicon oxide film, a silicon nitride film, and a silicon oxynitride film.

Referring to FIG. 22 and FIG. 23, the semiconductor memory device may further include a support pattern SUP contacting at least a portion of a sidewall of each of the semiconductor patterns SP so as to support the semiconductor patterns SP. One end of each of the first electrodes EL1 may be connected to the second impurity area SD2 of one of the semiconductor patterns SP, and the other end of each of the first electrodes EL1 may be connected to the support pattern SUP.

The support pattern SUP may physically support at least one of the first electrodes EL1 so that the at least one of the first electrodes EL1 is not bent. The support pattern SUP may commonly connect to the plurality of the first electrodes EL1. The support pattern SUP may include an insulating material, and thus may be embodied as one of a silicon oxide film, a silicon nitride film, and a silicon oxynitride film.

The three-dimensional semiconductor memory device according to some embodiments may include memory cell transistors MCT three-dimensionally stacked on the substrate 110 and the first electrodes EL1 (that is, the storage structures DS) respectively connected thereto and extending horizontally. As a result, an integration of the semiconductor memory device may be improved, compared to a conventional memory device including memory cell transistors two-dimensionally arranged on a substrate, and first electrodes (that is, storage structures) that are respectively connected thereto and extend vertically.

Figure 24:
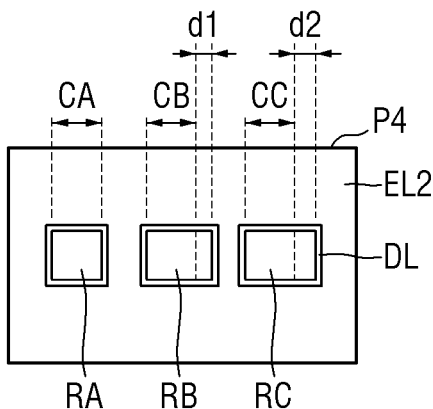
FIG. 24 is a diagram schematically showing layout data used in a portion of FIG. 22 to form a semiconductor memory device according to some embodiments.
Figure 25:
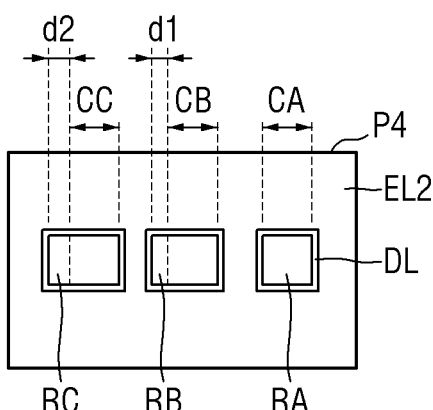
FIG. 25 is a diagram schematically showing layout data used in a portion of FIG. 22 to form a semiconductor memory device according to some embodiments, and is a diagram corresponding to FIG. 24.

FIG. 24 is a diagram schematically showing layout data used in a portion P4 of FIG. 22 to form a semiconductor memory device according to some embodiments. FIG. 25 is a diagram schematically showing layout data used in a portion P4 of FIG. 22 to form a semiconductor memory device according to some embodiments, and is a diagram corresponding to FIG. 24.

For convenience of description, the descriptions of the same contents as described above with reference to FIG. 1 to FIG. 23 may be omitted.

FIG. 24 to FIG. 25 are views showing layout data for forming the storage node SN of FIG. 2, that is, the first electrodes EL1 of FIG. 21 and FIG. 22.

The layout data may include data regarding a plurality of target patterns and a plurality of corrected patterns RA, RB, and RC obtained by correcting critical dimensions of the plurality of target patterns. Specifically, the data regarding the plurality of corrected patterns RA, RB and RC is obtained by gradually changing critical dimensions CA, CB, and CC of the plurality of target patterns in a relative manner to each other along one direction opposite to a direction in which an external force is applied the storage structures DS.

In this case, change amounts d1 and d2 in the critical dimensions CA, CB, and CC of the plurality of target patterns may be different from each other based on positions on the substrate 110 where the storage structures DS are to be formed. Accordingly, change amounts in areas of the top faces of the plurality of target patterns may also be different from each other based on the positions on the substrate 110 where the storage structures DS are to be formed.

Referring to FIG. 24, the change amounts d1 and d2 in the critical dimensions CA, CB, and CC along the first direction X of the target patterns may gradually increase in a relative manner to each other along the first direction X. Accordingly, the change amounts in the areas of the top faces of the target patterns may gradually increase in a relative manner to each other along the first direction X.

Referring to FIG. 25, the change amounts d1 and d2 a in the critical dimensions CA, CB, and CC long the first direction X of the target patterns may gradually increase in a relative manner to each other along a direction parallel to and opposite to the first direction X. Accordingly, the change amounts in the areas of the top faces of the target pattern may gradually increase in a relative manner to each other along the direction parallel to and opposite to the first direction X.

In one example, although not specifically illustrated, the change amounts d1 and d2 in the critical dimensions CC, CF, and CG of the target pattern may gradually increase in a relative manner to each other along the third direction Z or a direction opposite to the third direction Z. Accordingly, the change amounts in the areas of the target patterns may gradually increase in a relative manner to each other along the third direction Z or the direction opposite to the third direction Z.

Although non-limiting example embodiments of the present disclosure have been described with reference to the accompanying drawings, those of ordinary skill in the technical field to which the present disclosure belongs will be able to understand that the present disclosure may be implemented in other specific forms without changing the technical idea or characteristics thereof. Therefore, it should be understood that the embodiments as described above are illustrative and not restrictive in all respects.

What is claimed is:

1. A semiconductor memory device comprising:
a substrate extending in each of a first direction and a second direction that intersect each other; and
a plurality of storage patterns disposed on the substrate, and spaced apart from each other in each of the first direction and the second direction, wherein each of the plurality of storage patterns extends in a third direction intersecting a plane defined by the first direction and the second direction, and each of the plurality of storage patterns comprises a first face in contact with a respective one from among a plurality of storage contacts,
wherein the first face of each of the plurality of storage patterns has a first width along the first direction and a second width along the second direction,
wherein the first width of the first face of each of the plurality of storage patterns increases in a relative manner to each other in the first direction, while spacings in the first direction between adjacent ones of the plurality of storage patterns decrease in a relative manner to each other in the first direction, and
wherein the first direction is unidirectional, and the second direction is unidirectional.

2. The semiconductor memory device of claim 1, wherein the second width of the first face of each of the plurality of storage patterns increases in a relative manner to each other in the second direction.

3. The semiconductor memory device of claim 1, wherein areas of the first face of each of the plurality of storage patterns increases in a relative manner to each other in the first direction.

4. The semiconductor memory device of claim 3, wherein the areas of the first face of each of the plurality of storage patterns increase in a relative manner to each other in the second direction.

5. The semiconductor memory device of claim 1, wherein the substrate comprises a cell area, on which a memory cell array is disposed, and a peripheral area around the cell area,
wherein the first width of the first face of each of the plurality of storage patterns increases in a relative manner to each other as the plurality of storage patterns are closer to the peripheral area.

6. The semiconductor memory device of claim 5, wherein the second width of the first face of each of the plurality of storage patterns increases in a relative manner to each other as the plurality of storage patterns are closer to the peripheral area.

7. The semiconductor memory device of claim 5, wherein areas of the first face of each of the plurality of storage patterns increase in a relative manner to each other as the plurality of storage patterns are closer to the peripheral area.

8. The semiconductor memory device of claim 1, wherein each of the plurality of storage patterns further comprises a second face opposite to the first face, and a sidewall connecting the first face and the second face to each other and extending in the third direction,
wherein the semiconductor memory device further comprises a support pattern in contact with the sidewall of each of the plurality of storage patterns so as to support each of the plurality of storage patterns.

9. The semiconductor memory device of claim 1, wherein each of the plurality of storage patterns comprises a lower electrode, a capacitor dielectric film on the lower electrode, and an upper electrode on the capacitor dielectric film.

10. A semiconductor memory device comprising:
a substrate comprising a cell area on which a memory cell array is disposed, and a peripheral area disposed around the cell area, wherein the substrate extends in each of a first direction and a second direction that intersect each other; and
a plurality of storage patterns disposed on the substrate, and extending in a third direction intersecting a plane defined by the first direction and the second direction, wherein the plurality of storage patterns are respectively connected to a plurality of storage contacts,
wherein the plurality of storage patterns comprises a first storage pattern adjacent to the cell area, a second storage pattern adjacent to the peripheral area, and a third storage pattern between the first storage pattern and the second storage pattern,
wherein a width of the first storage pattern along the first direction, a width of the second storage pattern along the first direction, and a width of the third storage pattern along the first direction gradually increase in a relative manner to each other as the plurality of storage patterns are closer to the peripheral area,
wherein a spacing in the first direction between the second storage pattern and the third storage pattern is smaller than a spacing in the first direction between the first storage pattern and the third storage pattern, and
wherein the first direction is unidirectional, and the second direction is unidirectional.

11. The semiconductor memory device of claim 10, wherein a width of the first storage pattern along the second direction, a width of the second storage pattern along the second direction, and a width of the third storage pattern along the second direction gradually increase or decrease in a relative manner to each other as the plurality of storage patterns are closer to the peripheral area.

12. The semiconductor memory device of claim 10, wherein a spacing in the second direction between the second storage pattern and the third storage pattern is smaller than a spacing in the second direction between the first storage pattern and the third storage pattern.

13. The semiconductor memory device of claim 10, wherein the width along the first direction of the first storage pattern is smaller than or equal to 20% of the width along the first direction of the second storage pattern.

14. The semiconductor memory device of claim 10, wherein an aspect ratio of the first storage pattern, an aspect ratio of the second storage pattern, and an aspect ratio of the third storage pattern decrease in a relative manner to each other as the plurality of storage patterns are closer to the peripheral area.

15. The semiconductor memory device of claim 10, wherein the plurality of storage contacts comprise first to third storage contacts respectively contacting the first storage pattern, the second storage pattern, and the third storage pattern, wherein widths along the first direction of the first to third storage contacts are equal to each other.

* * * * *